(12) United States Patent
Kroushl et al.

(10) Patent No.: US 10,742,004 B2
(45) Date of Patent: Aug. 11, 2020

(54) MOTOR CONTROL CENTER (MCC) UNITS WITH RETRACTABLE POWER CONNECTOR AND INTERLOCKS INCLUDING A POWER CONNECTOR POSITION INTERLOCK

(71) Applicant: Eaton Intelligent Power Limited, Dublin (IE)

(72) Inventors: Daniel Boyd Kroushl, Clayton, NC (US); Alfred Gregory Beard, Raleigh, NC (US); Edgar Yee, Chapel Hill, NC (US)

(73) Assignee: Eaton Intelligent Power Limited, Dublin (IE)

( * ) Notice: Subject to any disclaimer, the term of this patent is extended or adjusted under 35 U.S.C. 154(b) by 42 days.

(21) Appl. No.: 15/848,103

(22) Filed: Dec. 20, 2017

(65) Prior Publication Data

US 2019/0190240 A1    Jun. 20, 2019

(51) Int. Cl.
| | | |
|---|---|---|
| *H02B 1/36* | (2006.01) |
| *H02B 1/38* | (2006.01) |
| *H02B 1/46* | (2006.01) |
| *H01H 71/12* | (2006.01) |
| *A47B 46/00* | (2006.01) |

(Continued)

(52) U.S. Cl.
CPC ............. *H02B 1/36* (2013.01); *A47B 46/005* (2013.01); *A47B 81/00* (2013.01); *H01H 71/128* (2013.01); *H02B 1/14* (2013.01); *H02B 1/38* (2013.01); *H02B 1/46* (2013.01); *H02B 11/24* (2013.01); *H05K 5/0017* (2013.01); *H05K 7/1414* (2013.01); *H02B 11/133* (2013.01); *H02B 11/173* (2013.01); *H05K 5/023* (2013.01); *H05K 5/0208* (2013.01); *H05K 5/0226* (2013.01);

(Continued)

(58) Field of Classification Search
CPC . H02B 1/36; H02B 1/14; H02B 11/24; H02B 11/127; H02B 11/133; H05K 5/0208; H05K 7/1414
See application file for complete search history.

(56) References Cited

U.S. PATENT DOCUMENTS

| | | |
|---|---|---|
| 1,838,898 A | 12/1931 | Aldeen |
| 2,042,886 A | 6/1936 | Ferguson |

(Continued)

FOREIGN PATENT DOCUMENTS

| | | |
|---|---|---|
| EP | 0109544 | 5/1984 |
| FR | 2747877 | 10/1997 |

(Continued)

OTHER PUBLICATIONS

Arc-flash—The threat that is real, Freedom Arc Resistant Motor Control Center, product brochure, Eaton, Mar. 2014, 2 pages.

(Continued)

*Primary Examiner* — Felix O Figueroa
(74) *Attorney, Agent, or Firm* — Myers Bigel, P.A.

(57) ABSTRACT

Motor control centers have units or buckets with an extendable/retractable power connection (stab) assembly and one or more operating lever interlocks that include a unit latch to latch to a cabinet and a power connection position interlock that blocks the handle of the units or buckets based on position of the power connection assembly, optionally also including a shutter cam that slides a shutter right and left.

21 Claims, 23 Drawing Sheets

(51) Int. Cl.
*A47B 81/00* (2006.01)
*H05K 5/00* (2006.01)
*H02B 11/24* (2006.01)
*H02B 1/14* (2006.01)
*H05K 7/14* (2006.01)
*H05K 7/16* (2006.01)
*H02B 11/133* (2006.01)
*H02B 11/173* (2006.01)
*H05K 5/02* (2006.01)

(52) U.S. Cl.
CPC ......... *H05K 5/0239* (2013.01); *H05K 5/0247* (2013.01); *H05K 7/16* (2013.01)

(56) References Cited

U.S. PATENT DOCUMENTS

| | | |
|---|---|---|
| 2,809,085 A | 10/1957 | Fall |
| 2,914,707 A | 11/1959 | Timmerman |
| 2,921,998 A | 1/1960 | Pokorny et al. |
| 3,203,575 A | 8/1965 | Anderson et al. |
| 3,479,104 A | 11/1969 | Kobryner |
| 4,024,441 A | 5/1977 | Coyle et al. |
| 4,086,452 A | 4/1978 | Collins |
| 4,090,230 A | 5/1978 | Fuller et al. |
| 4,206,944 A | 6/1980 | Kumagai et al. |
| 4,371,223 A | 2/1983 | Grunert et al. |
| 4,486,815 A | 12/1984 | Takahashi |
| 4,503,408 A | 3/1985 | Mrenna et al. |
| 4,612,424 A | 9/1986 | Clark et al. |
| 4,754,367 A | 6/1988 | Bohnen |
| 4,789,919 A | 12/1988 | Cox et al. |
| 4,806,710 A | 2/1989 | Kalvaitis et al. |
| 4,835,350 A | 5/1989 | Ozu et al. |
| 4,926,286 A | 5/1990 | Maki et al. |
| 5,006,682 A | 4/1991 | Sloff et al. |
| 5,343,355 A | 8/1994 | Ishikawa |
| 5,609,244 A | 3/1997 | Reiter |
| 5,625,531 A | 4/1997 | Padilla et al. |
| 5,910,760 A | 6/1999 | Malingowski et al. |
| 6,031,192 A | 2/2000 | Liebetruth |
| 6,087,602 A | 7/2000 | Bernier et al. |
| 6,194,983 B1 | 2/2001 | Bogdon et al. |
| 6,284,989 B1 | 9/2001 | Bernier et al. |
| 6,423,913 B1 | 7/2002 | Gupta et al. |
| 6,437,262 B1 | 8/2002 | Gupta et al. |
| 6,689,968 B2 | 2/2004 | Trivette et al. |
| 6,711,001 B2 | 3/2004 | Hernandez et al. |
| 6,943,999 B2 | 9/2005 | Gray et al. |
| 7,186,933 B2 | 3/2007 | Turner |
| 7,420,133 B2 | 9/2008 | Farrow et al. |
| 7,510,223 B2 | 3/2009 | Malkowski, Jr. et al. |
| 7,684,199 B2 | 3/2010 | Yee et al. |
| 7,688,572 B2 | 3/2010 | Yee et al. |
| 7,800,888 B2 | 9/2010 | Morris et al. |
| 7,965,493 B2 | 6/2011 | Leeman et al. |
| 7,987,555 B2 | 8/2011 | Chen et al. |
| 8,108,971 B2 | 2/2012 | Florek |
| 8,198,557 B2 | 6/2012 | Lee et al. |
| 8,199,022 B2 | 6/2012 | Morris et al. |
| 8,243,422 B2 | 8/2012 | Leeman et al. |
| 8,248,761 B2 | 8/2012 | Leeman et al. |
| 8,294,051 B2 | 10/2012 | Park et al. |
| 8,305,736 B2 | 11/2012 | Yee et al. |
| 8,395,064 B2 | 3/2013 | Kim et al. |
| 8,511,510 B2 | 8/2013 | Pratte et al. |
| 8,537,518 B2 | 9/2013 | Morris et al. |
| 8,590,106 B2 | 11/2013 | Lu |
| 8,710,390 B2 | 4/2014 | Kim |
| 8,791,362 B2 | 7/2014 | Kumar |
| 8,817,454 B2 | 8/2014 | Morris et al. |
| 8,891,229 B2 | 11/2014 | Fischer-Came et al. |
| 8,934,218 B2 | 1/2015 | Morris |
| 8,952,252 B2 | 2/2015 | Bugaris et al. |
| 9,153,947 B2 | 10/2015 | Fleitmann et al. |
| 9,451,718 B2 | 9/2016 | Oneufer et al. |
| 9,466,965 B2 | 10/2016 | Lehtola et al. |
| 9,472,369 B2 | 10/2016 | Dozier et al. |
| 9,531,169 B2 * | 12/2016 | Oneufer .................. H02B 1/46 |
| 9,607,784 B2 | 3/2017 | Benke et al. |
| 9,805,881 B2 | 10/2017 | Richards et al. |
| 9,825,439 B2 | 11/2017 | Yang et al. |
| 9,831,645 B2 | 11/2017 | Espinosa Gutierrez et al. |
| 9,871,356 B2 | 1/2018 | Bellows et al. |
| 9,882,358 B2 | 1/2018 | Kim |
| 10,186,847 B2 | 1/2019 | Kroushl et al. |
| 10,211,606 B2 * | 2/2019 | Kroushl ................ H05K 5/023 |
| 2008/0022673 A1 | 1/2008 | Morris et al. |
| 2008/0023211 A1 | 1/2008 | Yee et al. |
| 2008/0258667 A1 | 10/2008 | Morris et al. |
| 2009/0086414 A1 | 4/2009 | Yee et al. |
| 2012/0064746 A1 | 3/2012 | Bellows et al. |
| 2013/0077210 A1 | 3/2013 | Morris |
| 2013/0088812 A1 | 4/2013 | Yee et al. |
| 2014/0362498 A1 | 12/2014 | Morris et al. |
| 2015/0103472 A1 | 4/2015 | Oneufer et al. |
| 2015/0221458 A1 | 8/2015 | Oneufer et al. |
| 2015/0380910 A1 | 12/2015 | Oneufer et al. |
| 2015/0382492 A1 | 12/2015 | Oneufer et al. |
| 2017/0063056 A1 | 3/2017 | Oneufer et al. |
| 2017/0155234 A1 | 6/2017 | Benke et al. |
| 2017/0264085 A1 | 9/2017 | Cieply et al. |
| 2018/0083426 A1 | 3/2018 | Ali et al. |
| 2018/0083513 A1 | 3/2018 | Pharne |
| 2018/0084662 A1 | 3/2018 | Pharne |
| 2018/0096803 A1 | 4/2018 | Blochouse et al. |

FOREIGN PATENT DOCUMENTS

| | | |
|---|---|---|
| FR | 2814321 | 3/2002 |
| JP | S59-9459 U | 1/1984 |
| JP | 2011-234542 A | 11/2011 |
| WO | 2015047307 | 4/2015 |
| WO | WO 2015/047236 A1 | 4/2015 |

OTHER PUBLICATIONS

"Centerline® 2100 SecureConnect™: Help Reduce Exposure to Electrical Shock and Hazards" *Product Information Sheet, Allen-Bradley* www.rockwellautomation.com (4 pages).

Drawings/Views of internal components of an MCC (FLASHGARD) unit sold by Eaton, Inc. at least as early as 2012 (6 pages).

"Evolution E9000* MCC with AFM Arc Flash Mitigation Units for Low-Voltage Motor Control" Fact Sheet, *GE Industrial Solutions* (2 pages) (2014).

International Search Report and the Written Opinion of the International Searching Authority corresponding to International Patent Application No. PCT/IB2015/054355 (17 pages) (dated Oct. 26, 2015).

International Search Report and the Written Opinion of the International Searching Authority corresponding to International Patent Application No. PCT/IB2015/054356 (11 pages) (dated Aug. 19, 2015).

Invitation to Pay Additional Fees for related PCT Application No. PCT/IB2015/054356, date of mailing Aug. 19, 2015, 6 pages.

International Search Report and the Written Opinion of the International Searching Authority corresponding to International Patent Application No. PCT/US2017/057802 (15 pages) (dated Jan. 19, 2018).

International Search Report and the Written Opinion of the International Searching Authority corresponding to International Patent Application No. PCT/EP2018/025324 (8 pages) (dated Mar. 7, 2019).

* cited by examiner

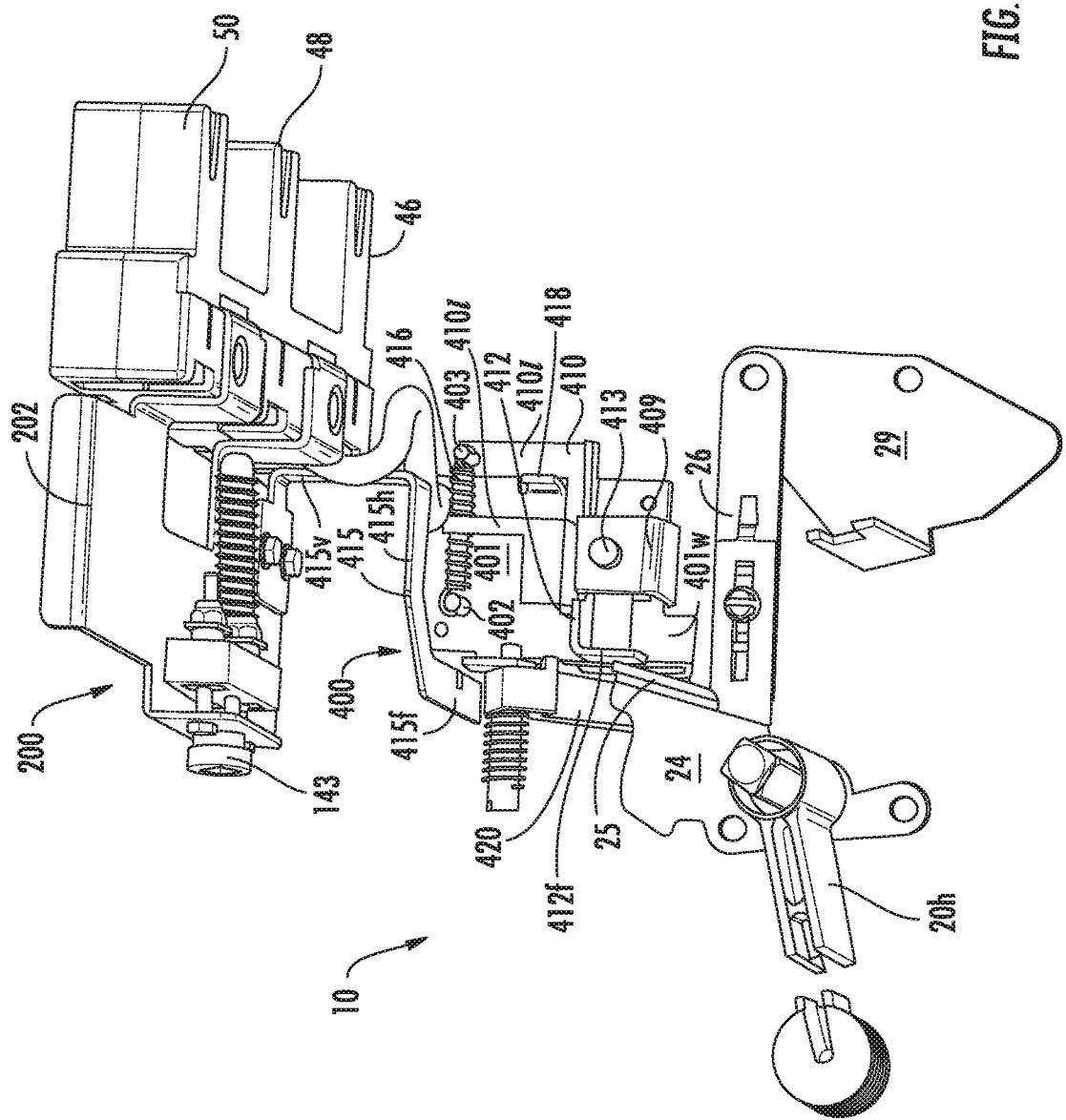

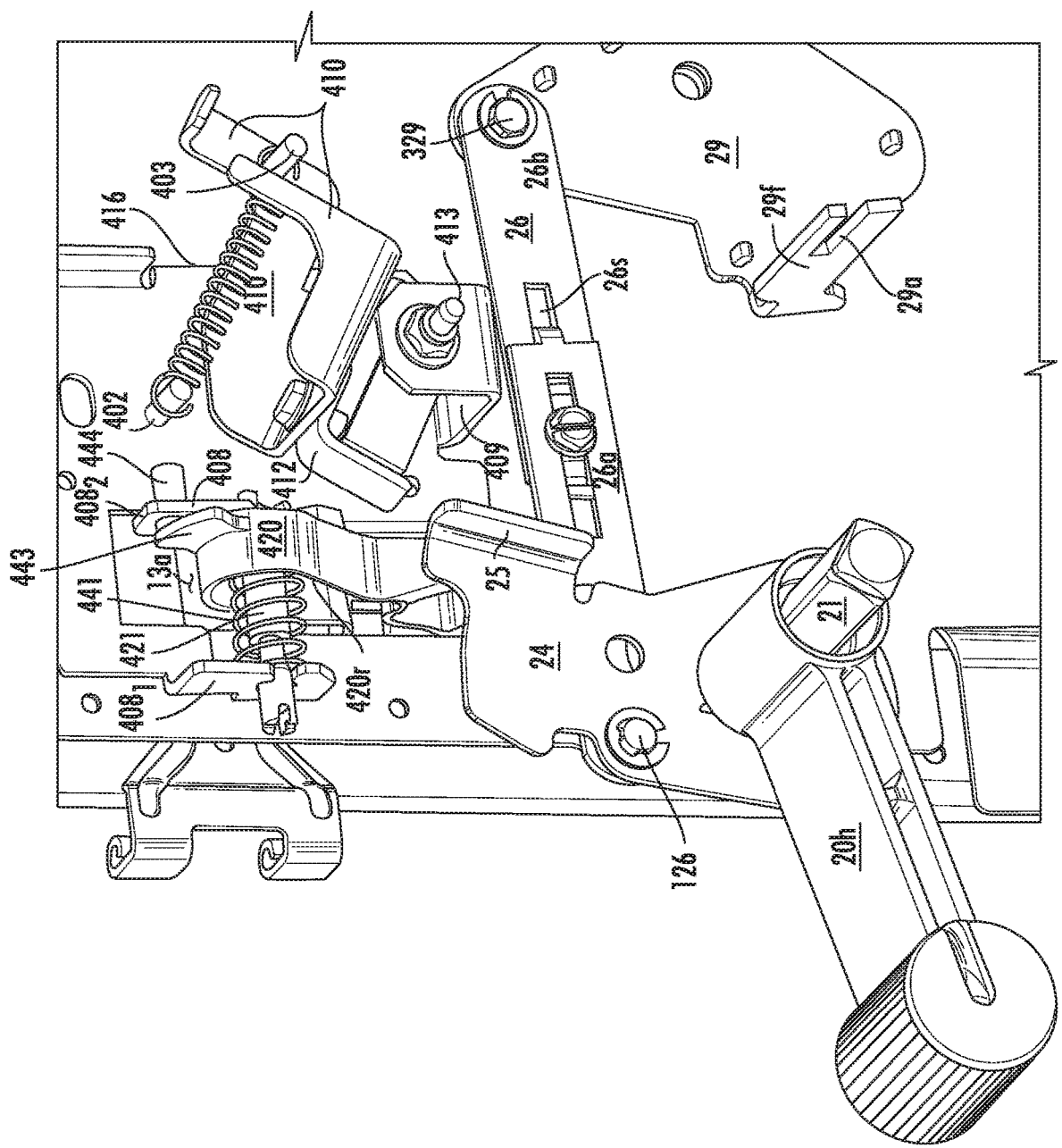

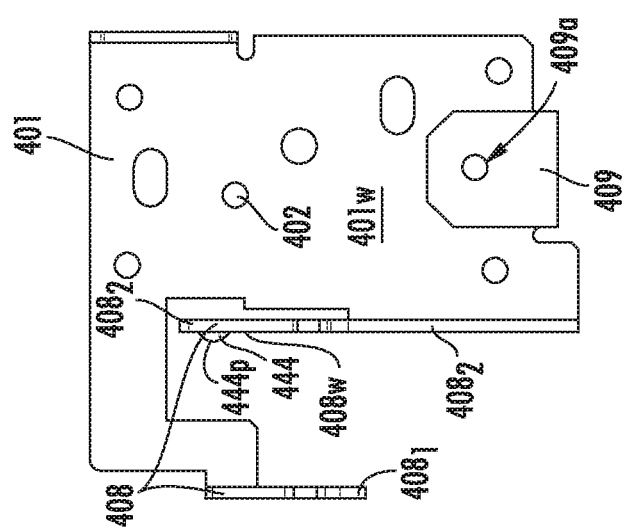
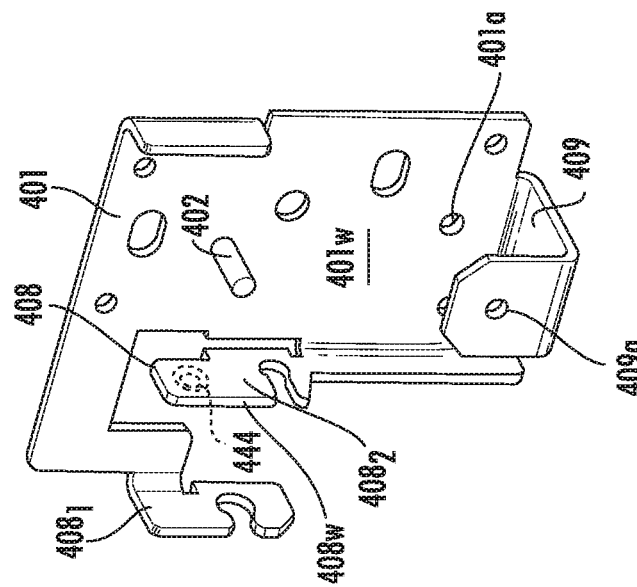
FIG. 18B
FIG. 18A

MOTOR CONTROL CENTER (MCC) UNITS WITH RETRACTABLE POWER CONNECTOR AND INTERLOCKS INCLUDING A POWER CONNECTOR POSITION INTERLOCK

FIELD OF THE INVENTION

The present invention relates to motor control systems and more particularly to motor control center units.

BACKGROUND OF THE INVENTION

As is known to those of skill in the art, a Motor Control Center (MCC) can include cabinets or enclosures that hold multiple, typically modular, bucket assemblies of various sizes. See, e.g., U.S. Pat. No. 4,024,441, the contents of which are hereby incorporated by reference as if recited in full herein. Eaton Corporation has recently introduced an MCC product line with compact bucket assemblies that conveniently plug into a slot or space in an MCC cabinet. The product is sold under the product name, Freedom 2100 MCC. See also, U.S. Patent Application Publication Serial Number US2013/0077210, the contents of which are hereby incorporated by reference as if recited in full herein.

MCCs are used, for example, in some commercial and industrial applications to distribute electrical power to a variety of loads (e.g., without limitation, relatively high power electrical motors, pumps, and other loads).

The bucket assemblies (also known as "buckets" or "units") can include respective handles that are disposed on the front door. See, e.g., U.S. Pat. Nos. 6,194,983 and 7,186,933, the contents of which are incorporated by reference as if recited in full herein. FIG. 1, for example, shows a portion of a prior art motor control center 100. The motor control center 100 includes a multi-compartment enclosure 12 (also referred to as a cabinet) with sidewalls 12w for receiving a plurality of motor control units 10. Typically, each bucket 10 is a removable, pull-out unit that has a respective door 22 (which may be under a front panel). The door 22 is typically coupled to the enclosure housing 12 by hinges 28 (shown in phantom line drawing in FIG. 1) to permit access to motor control components of the bucket 10 while it is installed in the enclosure 12. For example and without limitation, the door 22 can permit access to a disconnect circuit assembly 30, a stab indicator 32, a shutter indicator 34, and a line contact actuator 36. When the bucket 10 is fully installed and electrically connected, a user-operator may operate the disconnect handle 20h.

In a de-energized state of the motor control center 100, the user-operator may operate an isolation feature by moving a slide 140 and inserting crank 42 through an access portal or hole 43 in a cover of the bucket to access the line contact actuator or leadscrew 143 to move a number of electrical connectors with line contacts (see, for example, stab power contacts "S" or 46,48,50 of the prior art bucket 10 of FIG. 2) to an isolated position out of (see FIG. 2) electrical contact with power lines or buses of the motor control center 100. Motor control centers and units therefore (also sometimes called "subunits") are described in greater detail, for example, in commonly assigned U.S. Patent Application Publications 2009/0086414, 2008/0258667, 2008/0023211 and 2008/0022673, which are hereby incorporated herein by reference.

Despite the above, there remains a need for alternate bucket configurations.

SUMMARY OF EMBODIMENTS OF THE INVENTION

Embodiments of the invention provide bucket assemblies, i.e., units, with a power connector position interlock and a pivoting latch interlock member that latches to a cabinet, both of which can independently interlock the handle.

Embodiments of the present invention are directed to bucket assemblies that include: a unit housing having a front and opposing laterally spaced apart sidewalls; an operator handle facing the front of the unit housing; a laterally extending shaft attached to the operator handle and residing inside the unit housing; a handle cam attached to the operator handle residing inside the unit housing; a power connection assembly held in the unit housing, the power connection assembly including power connectors movable between power connection extended and retracted positions; and a power connection position interlock in the unit housing. The power connection position interlock is coupled to the power connection assembly and can engage the handle cam and block the handle cam from movement towards an ON position when the power connection assembly is in the retracted position.

The bucket assembly can further include a coupler attached to a carriage of the power connection assembly that can pivot the power connection position interlock when the power connection assembly is in the extended position to unblock the handle cam.

The coupler can have a first segment that extends down under the carriage a distance. The first segment can merge into a second segment that extends a distance forward thereof. The second segment can merge into a third segment that is orthogonal to the second segment. The power connection position interlock can have an upwardly extending leg that cooperates with the third segment to pivot the power connection position interlock upward when the power connection assembly is in the extended position. When the power connection assembly is in the retracted position, the third segment of the coupler can reside forward of the leg which allows the upwardly extending leg to pivot down and block the handle cam (from rotation towards an On position).

The bucket assembly can further include a mount bracket attached to one of the sidewalls of the unit and a biasing member. The mount bracket can have an inwardly extending first post. The power connection position interlock can have an upwardly extending leg that holds an inwardly extending second post. The biasing member can be attached to the first and second posts whereby the power connection position interlock member is biased to pivot down to a home position associated with the retracted position of the power connection assembly.

The power connection position interlock can be held by a mount bracket attached to one of the sidewalls of the unit. The mount bracket can include a pivot plate bracket that holds a laterally extending shaft that is coupled to the power connection position interlock and allows the power connection position interlock to pivot up and down relative to the pivot plate bracket.

The pivot plate can have a front segment that extends vertically in a home position associated with the retracted position of the power connection assembly whereby the front segment of the pivot plate allows the power connection position interlock to block the handle cam from rotation towards an ON position.

The bucket assembly can further include a mount bracket attached to one of the sidewalls of the unit housing. The mount bracket can include: a pivot plate bracket that is under a carriage of the power connection assembly and pivotably supports the power connection position interlock; first and second spaced apart unit latch shaft support flanges residing above the pivot plate bracket; and a unit latch comprising a shaft that is held by the first and second spaced apart unit latch support flanges. The shaft of the unit latch can be orthogonal to the shaft of the operator handle. The unit latch can pivot between latched and unlatched positions to latch to a cabinet of a motor control center (MCC).

The unit latch can include an upwardly extending flange that is above the shaft of the unit latch and the flange can includes or be coupled to a detent member.

The flange can have at least one pocket that slidably engages the detent member and the detent member can be held by the second unit latch shaft support flange.

The at least one pocket can include first and second spaced apart pockets separated by a wall segment having a greater wall thickness than the pockets.

The at least one pocket can include first and second spaced apart pockets having a change in depth of the flange relative to an adjacent wall segment thereof.

The detent member can include a projection in the second post that extends toward the front of the unit.

The detent member can have a spring-loaded ball bearing held by the second post.

The bucket assembly can further include a spring held about the shaft of the unit latch between the first and second unit latch support posts.

The handle cam can include a plate with a curvilinear perimeter and a laterally inward extending ledge that is orthogonal to the plate. The ledge can contact the unit latch when the unit latch is in the unlatched position. The ledge can contact the power connection position interlock when the power connector assembly is in the retracted position and the unit latch is in the latched position.

The power connection assembly can further include an internal lead screw having a portal that is above the operator handle adjacent the front panel. The bucket assembly can further include a shutter that is in front of the internal lead screw. The shutter portal can slide laterally to block access to the lead screw.

The bucket assembly can further include: an upwardly extending shutter linkage that is attached to the laterally extending shaft of the operator handle; and a shutter cam attached to the shutter linkage and in communication with the shutter. The shutter can have a shutter portal. The shutter can cooperate with the shutter cam to laterally slide the shutter to a position that misaligns the shutter portal with a lead screw to block access to the lead screw when the operator handle is in a defined position.

Other embodiments are directed to a motor control center that includes at least one of the bucket assembly.

Some embodiments are directed to methods of operating a unit of a Motor Control Center (MCC). The methods include: providing a unit with a retractable/extendable power connection assembly, a unit latch and a power connection position interlock, both selectively in communication with a handle cam of a handle of the unit; blocking movement of the handle cam of the handle of the unit by the unit latch if the latch is not engaged with a cabinet of the MCC; blocking movement (from rotation towards an On position) of the handle cam of the unit by the power connection position interlock if the power connection assembly is not in its extended state; rotating the unit latch from an unlatched latched to a latched state whereby the unit latch engages the cabinet and allows the handle cam to rotate inward past the unit latch; and pivoting the power connection position interlock member in response to movement of a carriage of the power connector assembly to allow the handle to rotate.

The unit latch can be held by first and second spaced apart flanges. The methods can further include slidably moving a detent member into at least one pocket of a flange of the unit latch or the second shaft support flange to provide tactile feedback of movement to the appropriate latch and/or unlatch position.

The unit latch and the power connection position interlock can both be held by a mount bracket attached to one sidewall of the unit, with the unit latch in front of the power connection position interlock. The pivoting can be carried out by contacting an upwardly extending leg of the power connection position interlock with a coupler attached to a carriage of the power connection assembly. The blocking movement of the handle cam of the unit by the power connection position interlock can be carried out by pivoting a pivot plate under the upwardly extending leg downward so that a front segment of the pivot plate of the power connection position interlock blocks the handle cam (from rotation towards an On position).

The units can include an operator handle that can cooperate with an internal sliding shutter to prevent access to a portal for an isolation feature and can be attached to an internal cam that engages a pivot plate that is attached to a lever of a breaker and move the lever in response to movement of the operator handle between ON and OFF positions. The portal can allow a user-operator to insert a device through an access portal and into a socket, typically a hand crank, to retract or extend stabs in the units.

Embodiments of the invention are directed to a bucket assembly that includes a unit housing having a front and opposing laterally spaced apart sidewalls extend rearward of the front of the unit housing. The bucket assembly also includes an operator handle facing the front of the unit housing.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIGS. 7C and 7D are partial, side perspective views of the power connector assembly shown in FIGS. 7A and 7B coupled to the power connector position interlock assembly shown in FIG. 6A according to embodiments of the present invention.

FIG. 8 shows the shutter positioned with a shutter portal providing access to the lead screw while FIG. 9 shows the shutter translated to block access according to embodiments of the present invention.

FIG. 12B is an enlarged partial side perspective view of a unit with the handle not blocked by the power connector position interlock assembly when the power connectors are extended according to embodiments of the present invention.

FIG. 18A is a side perspective view of a unit interlock mounting bracket according to embodiments of the present invention.

FIG. 18B is a side view of the unit interlock mounting bracket shown in FIG. 18A.

DETAILED DESCRIPTION OF EMBODIMENTS OF THE INVENTION

Figure 1:
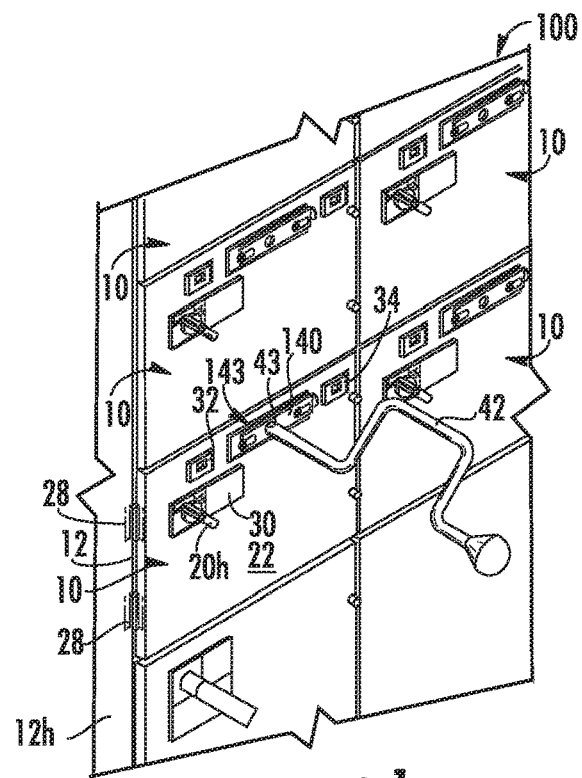
FIG. 1 is a partial front perspective view of an exemplary prior art Motor Control Center (MCC).

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'").

The term "Fig." (whether in all capital letters or not) is used interchangeably with the word "Figure" as an abbreviation thereof in the specification and drawings. In the figures, certain layers, components or features may be exaggerated for clarity, and broken lines illustrate optional features or operations unless specified otherwise. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In the present disclosure, the terms "bucket" or "unit" are used interchangeably and are intended to mean a motor control center unit that may be configured to be a removable modular unit capable of being installed behind individual or combined sealed doors on the motor control center enclosure. The unit may contain various motor control and motor protection components such as motor controllers, starters, contactor assemblies, overload relays, circuit breakers, motor circuit protectors, various disconnects, and similar devices for electric motors. The unit is configured to connect to a common power bus of the motor control center and conduct supply power to the line side of the motor control devices for operation of motors or feeder circuits.

Figure 2:
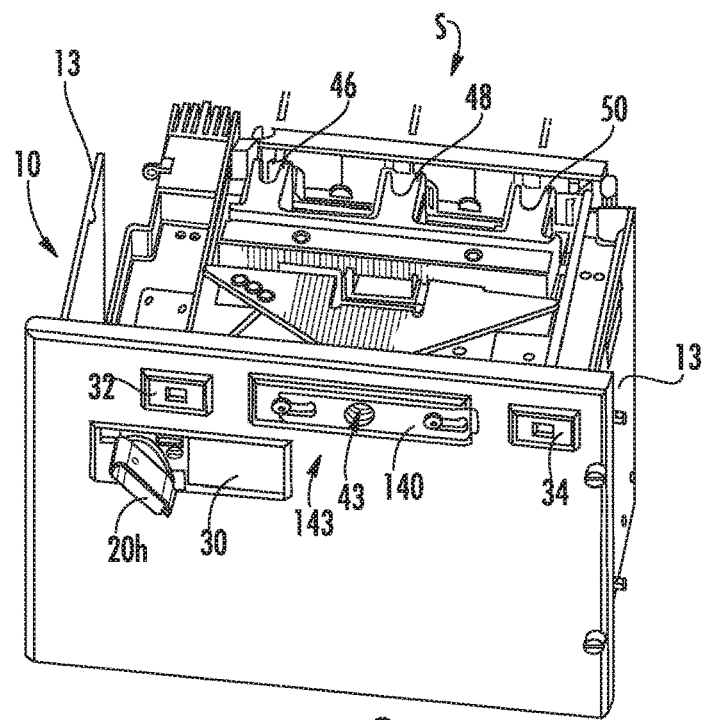
FIG. 2 is a top perspective view of an example of a prior art unit of the MCC shown in FIG. 1.

As discussed before, units may be configured as "starter units" for supplying power to and/or controlling electrical motors and pumps or as general "feeder units" for supplying feeder circuits. The terms "bucket assembly", bucket" and "unit" are used interchangeably and refer to a structure (typically having sides of a protective metal shell) that contains either a switch with a fuse or a circuit breaker for turning power ON and OFF to a motor, or feeder circuit, typically for controlling power to motor starters. As noted above, the bucket or unit can be a feeder unit or a starter unit. The bucket can include other components such as a power transformer, a motor starter to control a single motor and PLCs (programmable logic controllers), drives and the like. The bucket can be configured as a modular device to allow the internal components to be assembled as a unit that can be easily installed into a Motor Control Center (MCC) compartment. As is well known, the bucket 10 can have a bus grid with power stabs "S", shown as three power connectors 46, 48, 50 (FIG. 2) that can extend out of the back of the bucket 10 that connect to bus bars that carry power (current) to the compartments of a vertical section in an MCC cabinet 100 (FIG. 1). The bus bars are connected to larger horizontal bus bars that bring power to the vertical sections. The horizontal bus bars are usually in the top, but some MCC designs may have them in the center or bottom.

A "feeder unit" refers to a motor control center unit, for supplying feeder circuits. A feeder unit may have one or more feeders or power supply lines to supply feeder circuits or devices. A feeder unit (also called a "feeder") can have a "line side", which refers to the side of the feeder configured to be directly or indirectly connected to the common power bus of the motor control center. A feeder can also have a "load side", which refers to the side of the feeder configured to be connected to and deliver current to a feeder circuit. A feeder may comprise a circuit breaker, a fuse and disconnect switch, or another configuration. The terms "feeder circuit" and "feeder device" are used interchangeably and are intended to mean circuits or devices connected to feeder units or "feeders".

A disconnect switch such as a "circuit breaker", "breaker", "disconnect switch and fuse", "molded case circuit breaker", "MCCB" are devices designed to open and close a circuit, typically allowing both manual open and close operation and automatic circuit interruption, the latter to open a circuit under certain conditions, e.g., an overcurrent. The disconnect switch can be for a motor starter unit or feeder unit, for example.

The terms "motor", "load", and "load device" are used interchangeably and are intended to mean devices bearing electrical load that are connected to and controlled by the motor control center. Load devices are typically motors but may also be pumps or other machinery that may comprise motors or pumps. Load devices may be connected to starter units.

The terms "operating mechanism" and "operator mechanism" are used interchangeably and refer to an assembly for moving contacts in a switching mechanism between first and second positions in a circuit and/or for opening and closing separable main contacts, in a disconnect circuit such as a circuit breaker or for turning power ON and OFF using a switch associated with a fuse as a disconnect.

MCCs usually have a wire way for wires from respective units 10 to the motors and other loads and control wires. U.S. Patent Application Publication 2013/0077210 describes an MCC with both right and left side wireways, the contents of which are hereby incorporated by reference as if recited in full herein. The wireways are typically provided as an enclosed space in an MCC cabinet proximate but outside stacked units. MCCs can be configured in many ways. Each compartment can have a different height to accept different frame sizes of respective bucket assemblies or units 10, typically in about 6-inch increments. The vertical bus can be omitted or not run through the full height of the section to accommodate deeper buckets for larger items like variable frequency drives. The MCC can be a modular cabinet system for powering and controlling motors or feeder circuits. Several may be powered from main switchgear which, in turn, gets its power from a transformer attached to the incoming line from the power company. A typical MCC cabinet is an enclosure with a number of small doors arranged in rows and columns along the front. The back and sides are typically flat and mostly featureless. The buckets can be provided in varying sizes. For starter units, the size can be based on the size of the motor they are controlling. The bucket assembly can be configured to be relatively easily removable for repair, service or replacement. MCCs can have regular starters, reversing starters, soft start, and variable frequency drives. MCCs can be configured so that sections can be added for expansion if needed. The buckets or units 10 of a motor control center 100 can have the same or different configurations.

Figure 3:
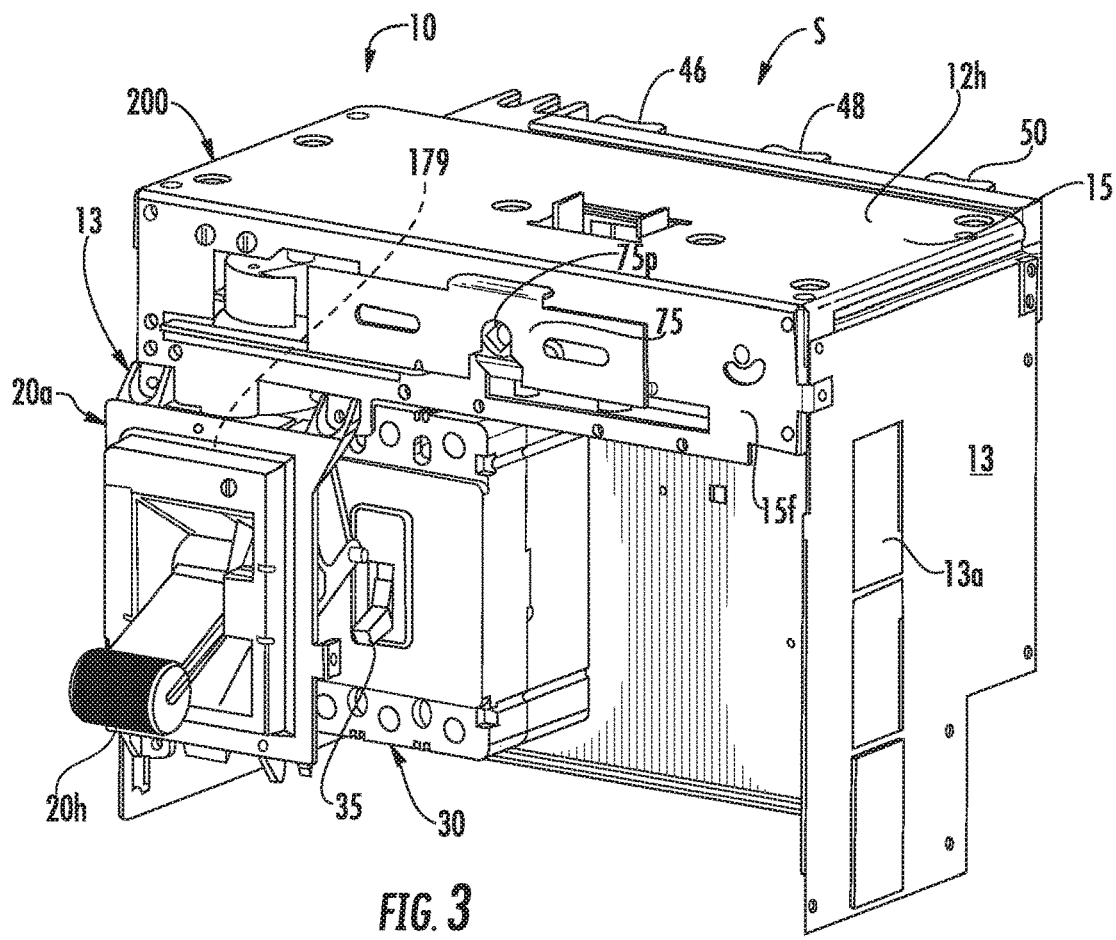
FIG. 3 is a front perspective view of an exemplary unit according to embodiments of the present invention.

The terms "right side" and "left side" refer to when the unit or MCC is viewed from the front, e.g., the front is associated with the unit 10 orientation shown in FIG. 3, for example, with the handle 20h facing forward and the disconnect connectors 46, 48, 50 facing rearward as shown.

The term "compact" refers to units 10 held in a condensed configuration (package) relative to conventional units/buckets. The MCC structure or cabinet 100 (FIG. 1) can be designed to receive multiple bucket units 10 ranging in various defined sizes. The units 10 can be provided in package or frame sizes of about 6 inches to about 72 inches (tall) with substantially common depth and width dimensions, known as 1× (6 inches) to 12× (72 inches) sizes. The sizes can be in single X increments, from 1×, 2×, 3×, 4×, 5×, 6×, 7×, 8×, 9×, 10×, 11× and 12×. Thus, a 5×MCC unit 10 can be about 30 inches tall. The frame sizes can be provided for a plurality of amperages, including a plurality of: 125 A, 150 A, 225 A, 250 A, 400 A, 600 A, 1200 A and 2000 A, for example. A unit 10 is typically about 7 inches deep but larger or smaller sizes may be appropriate in some embodiments.

Referring to FIG. 3, the unit 10 can have a handle assembly 20a with a handle 20h that can communicate with an internal shutter 75 residing adjacent, and typically above, the handle 20h. The term "handle" with respect to the operator handle input can interchangeably referred to as a "handle lever" or "lever operator" herein. The handle 20h can be provided as a vertical handle that moves up and down between first and second positions, typically ON and OFF positions associated with conduction and non-conduction, respectively. In other embodiments, the handle 20h can be provided as a rotary (circumferentially rotational) handle configuration. It is noted that the exemplary unit 10 is shown as a single feed, but may be a dual feed configuration, typically in side by side arrangements, but it is contemplated that vertically aligned handles 20h may also or alternatively be used with the respective circuits/switch assemblies 30 placed in the unit accordingly.

As shown in FIGS. 3 and 4A-4C, the bucket assembly or unit 10 includes a handle assembly 20a that cooperates with the shutter 75 and an operator mechanism 40 that engages the lever/toggle 35 of the switch assembly 30. As shown, for example, in FIGS. 3 and 5, the unit 10 also includes a retractable power connector assembly 200 with a lead screw 143 as will be discussed further below. The bucket assembly 10 can be configured for DC (direct current) or AC (alternating current) operation.

The handle assembly 20a can include a front cover plate 23 (which may also be referred to as a "housing") with a channel 23c that allows the handle lever 20h to pivot up and down between first and second positions, typically, but not limited to, ON and OFF positions. The front cover plate 23 can include visual indicia 23i (i.e., text) identifying the position of the handle 20h relative to the first and second positions of the switch (i.e., ON, OFF status) of the unit 10. The handle assembly 20a can include an internal cam 24, such as a shaped cam plate 24p that is attached to the handle 20h via a shaft 21. The shaft 21 can be orthogonal to the cam 24 and the handle lever 20h so that the handle lever 20h rotates along a common axis A-A with the cam plate 24.

As shown in FIG. 3, for example, the bucket assembly 10 can have a metal enclosure with sidewalls 13, and a metal ceiling 15. The metal ceiling 15 can extend down in a front direction to form a partial internal front upper wall 15f (the metal ceiling and partial front wall can also be referred to as a "top wrapper") that resides in front of the disconnect operator mechanism 40 and in front of the lever 35 of the disconnect circuit assembly 30. The partial front wall 15f can be a shaped front internal partial wall as an extension of the top or may be attached to the top as a separate component.

Figure 4A:
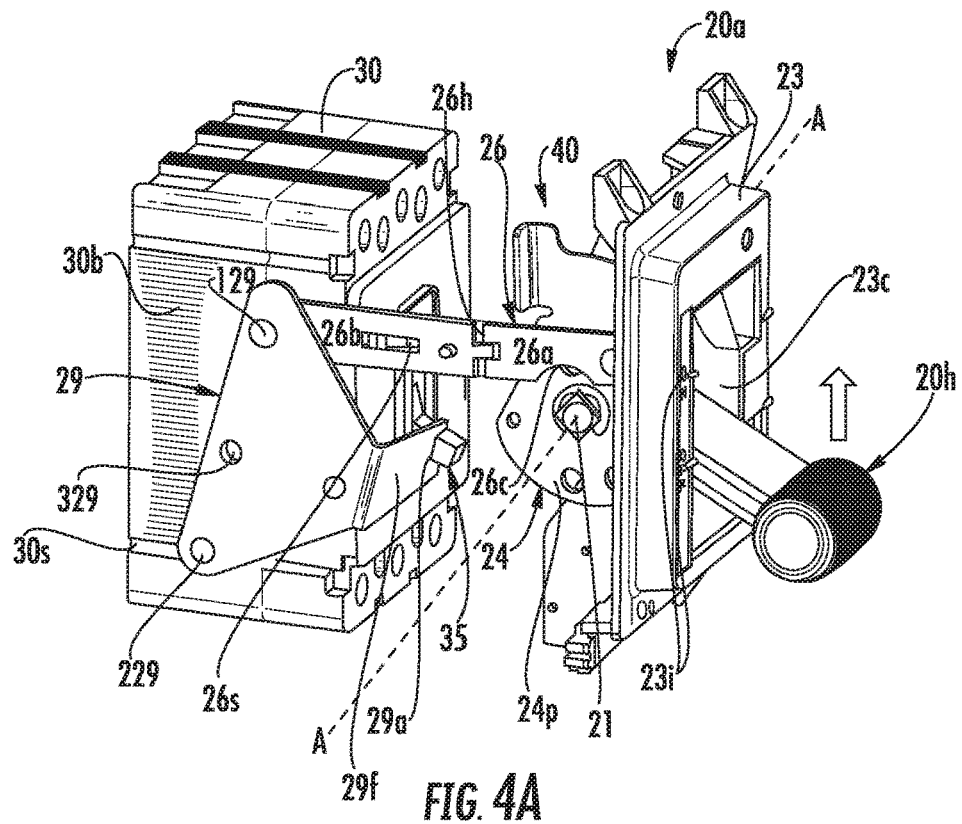
FIGS. 4A-4C are partial side perspective views of exemplary "OFF" (FIG. 4A), "ON" (FIG. 4B) and optional "TRIP" (FIG. 4C) operational positions of the handle assembly shown in FIG. 3 for the associated internal disconnect according to embodiments of the invention.
Figure 4B:
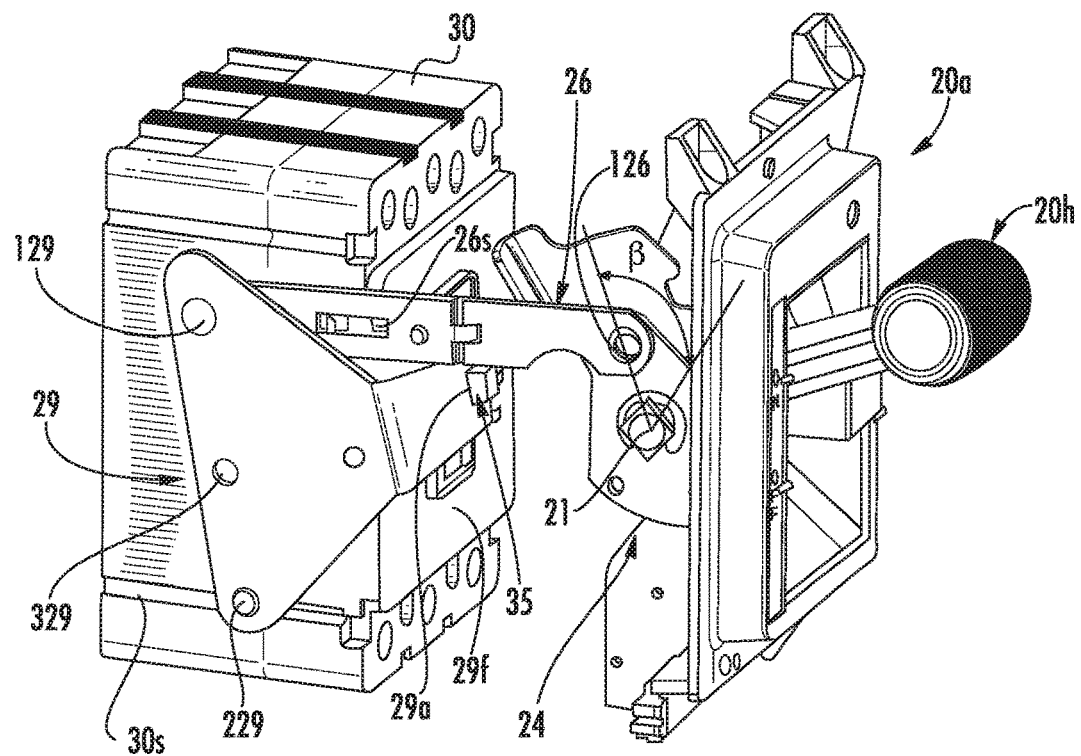
Figure 4C:
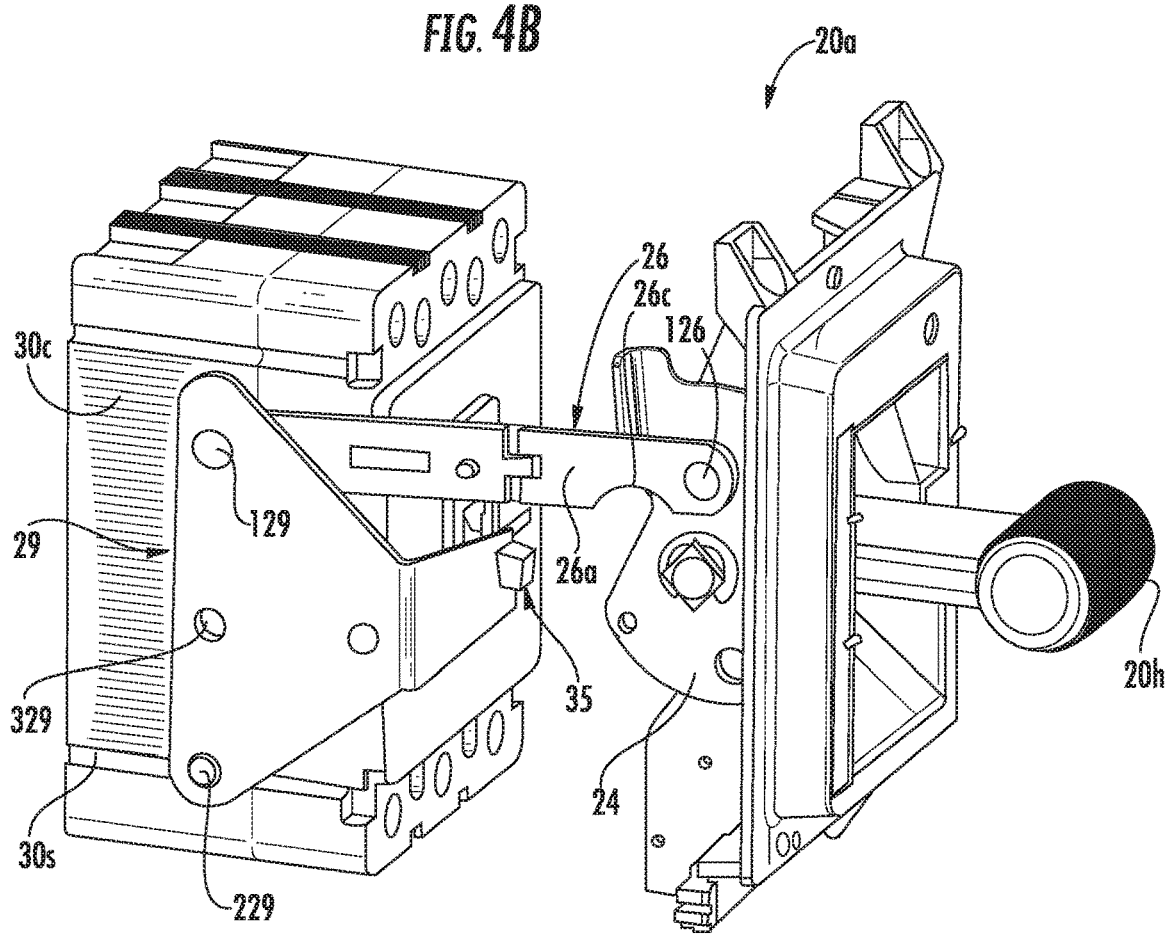

As shown in FIGS. 4A-4C, the cam plate 24p, pivot plate 29 and linkage 26 may be conventional components used in known buckets 10 with the handle assembly 20a modified as shown in FIG. 3, for example, and other figures as will be discussed further below.

The operator mechanism 40 can include a linkage 26 that is attached to the cam 24. The cam 24 can be attached to the linkage 26 via attachment member 126 that can reside on an upper end portion of the cam 24 above the shaft 21. The linkage 26 can extend inward and attach to a pivot plate 29 using an attachment member 129. The pivot plate 29 engages the lever 35 of the disconnect switch assembly 30 to move the lever 35 between first and second positions, i.e., between ON and OFF positions.

The linkage 26 can optionally have an end portion that has an arcuate (curved) shape 26c that faces the shaft 21. The linkage 26 can comprise cooperating first and second links 26a, 26b which may be hingeably attached at hinge 26h. The innermost link 26b can comprise a slot 26s and the other link 26a can comprise the arcuate segment 26c.

The pivot plate 29 can be attached to a horizontally extending channel 30s via attachment member 229. Where used, and optionally, the attachment member 229 can move straight forward and rearward in the channel 30s in response to the opposite movement (rearward and forward movement) of the linkage 26. The channel 30s may be a slot directly formed in the sidewall of the body 30b or may be provided by a pair of rails or other members held by the (disconnect) switch assembly 30, typically at a lower sidewall of the body 30b. Also optionally and/or alternatively, the pivot plate 29 can be attached to the sidewall 13 (FIG. 3) of the bucket 10 via attachment member 329 to allow a pivoting motion of the pivot plate 29 relative to the sidewall 13 and does not require any connection to the slot nor any slot 30s in the body 30b.

The pivot plate 29 can have a side portion that merges into a front portion 29f that has a laterally extending front segment that may extend a partial distance over the front of the body 30b of the disconnect switch assembly 30 to engage the lever 35. The laterally extending front segment 29f can have an aperture 29a with upper and lower segments extending about the aperture 29a. The lever 35 extends through the aperture 29a a distance for secure engagement. The front segment 29f may alternatively extend entirely across the front of the body 30b (not shown). The aperture 29a can be an open gap or window or an open or closed slot in the wall of the laterally extending front segment 29f.

As shown in FIGS. 4A and 4B, lifting the handle lever 20h up from the first position a sufficient distance causes the cam 24 to rotate counterclockwise and push the lever 35 from the first position to the second position (typically from the OFF to the ON position). In the reverse, rotating the handle lever 20h down from the second position to the first position causes the lever 35 to rotate down to the first position. As shown in FIGS. 4A and 4B, the cam 24 can rotate at an angle "β" that is between about 30-45 degrees to move the linkage 26 inward a distance to pivot the pivot plate 29 upward to move the lever 35 upward to the second position (i.e., the ON position).

FIG. 4C illustrates an On to Trip configuration. If the breaker is in the On position and trips, the breaker lever 35 will rotate to the tripped position which drives the handle lever 20h to the tripped position which is the position shown in FIG. 4C, with the linkage 26 substantially horizontal (+/−10% of horizontal) and/or the handle 20h substantially horizontal (+/−10% of horizontal) or at least more horizontal relative to either the On or Off positions thereof.

Figure 5:
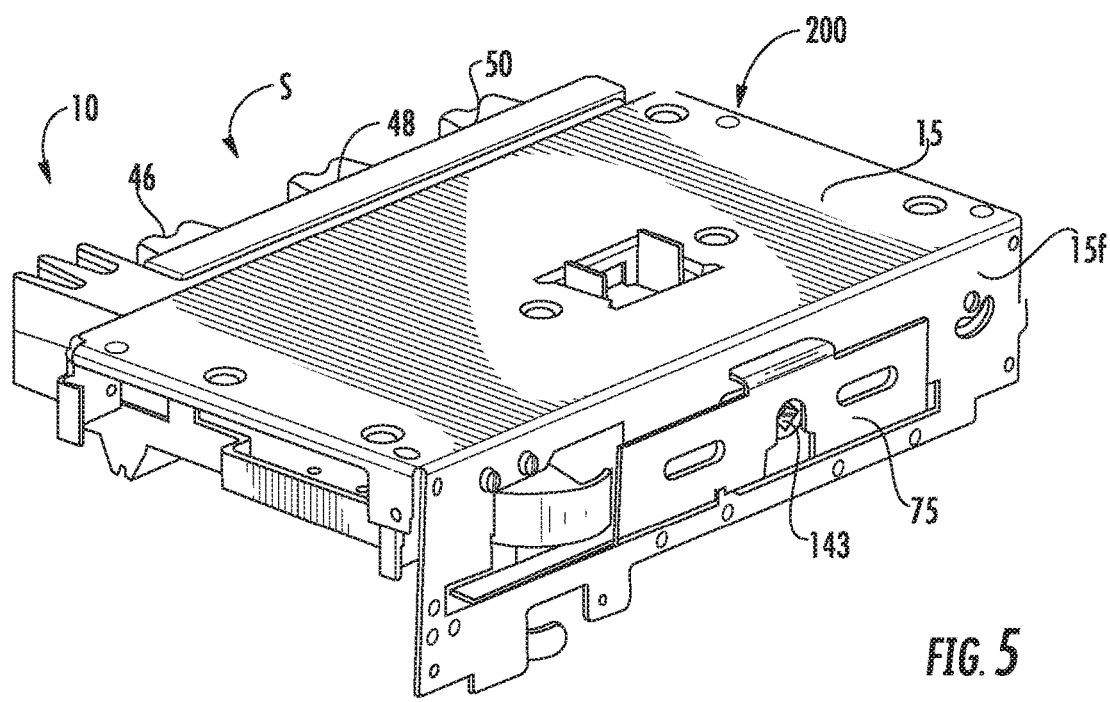
FIG. 5 is a front, side perspective view of a retractable power assembly for a unit and an internal slidable shutter with the external cover over the racking (stab isolation) portal omitted according to embodiments of the present invention.
Figure 7A:
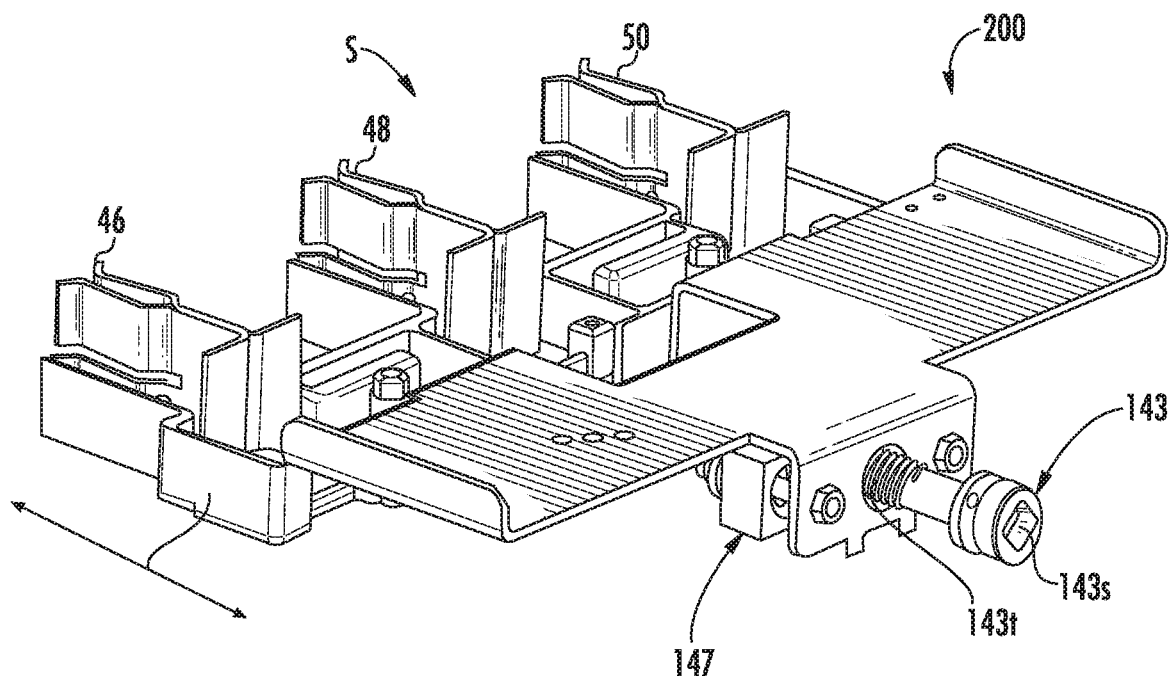
FIGS. 7A and 7B are front, side perspective views of the unit shown in FIG. 5 without the top cover illustrating a retractable/extendable power connector (stab) configuration (FIG. 7A shows the power connectors partially retracted and FIG. 7B shows them fully extended) according to embodiments of the present invention.
Figure 7B:
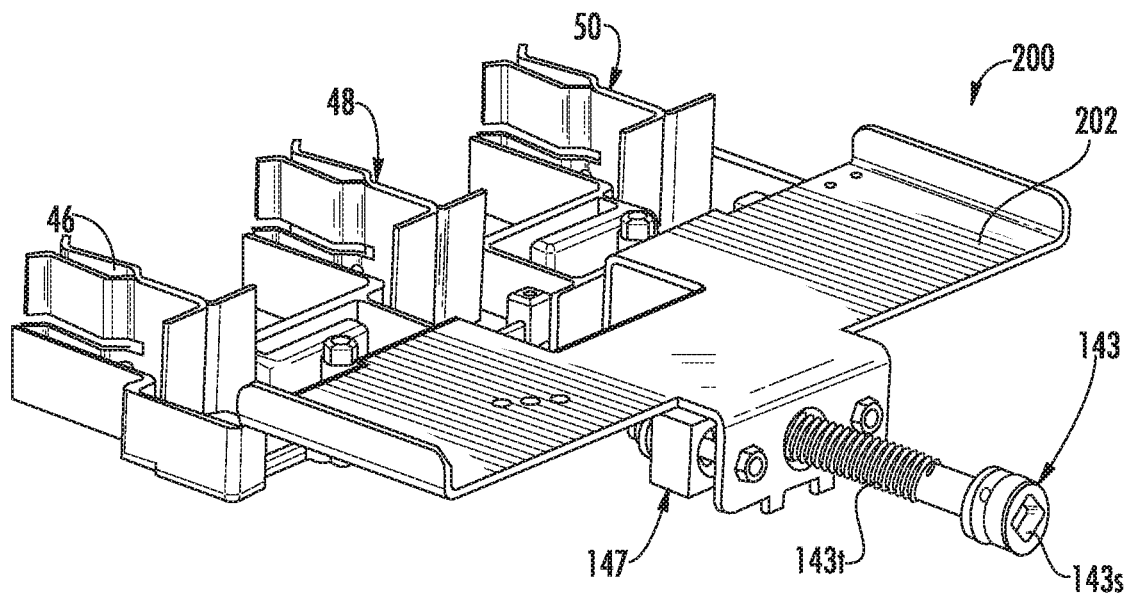

As shown in FIGS. 3 and 5, the unit 10 can comprise a retractable power connector assembly 200 with a carriage 202 (FIG. 7B) that holds the power connectors 46, 48, 50 which allows the operator to extend and retract the power connects 46, 48, 50 by rotating a lead screw 143 (FIGS. 7A, 7B). In order for the unit 10 to be either installed into or removed from the cabinet 100, the power connectors 46, 48, 50 must be in the retracted position which isolates the bucket 10 from the bus bars. See, U.S. Pat. No. 7,668,572, the contents of which are hereby incorporated by reference as if recited in full herein. The unit 10 also includes the slidable shutter 75 with a portal 75p that can block external access to the lead screw 143.

Figure 6A:
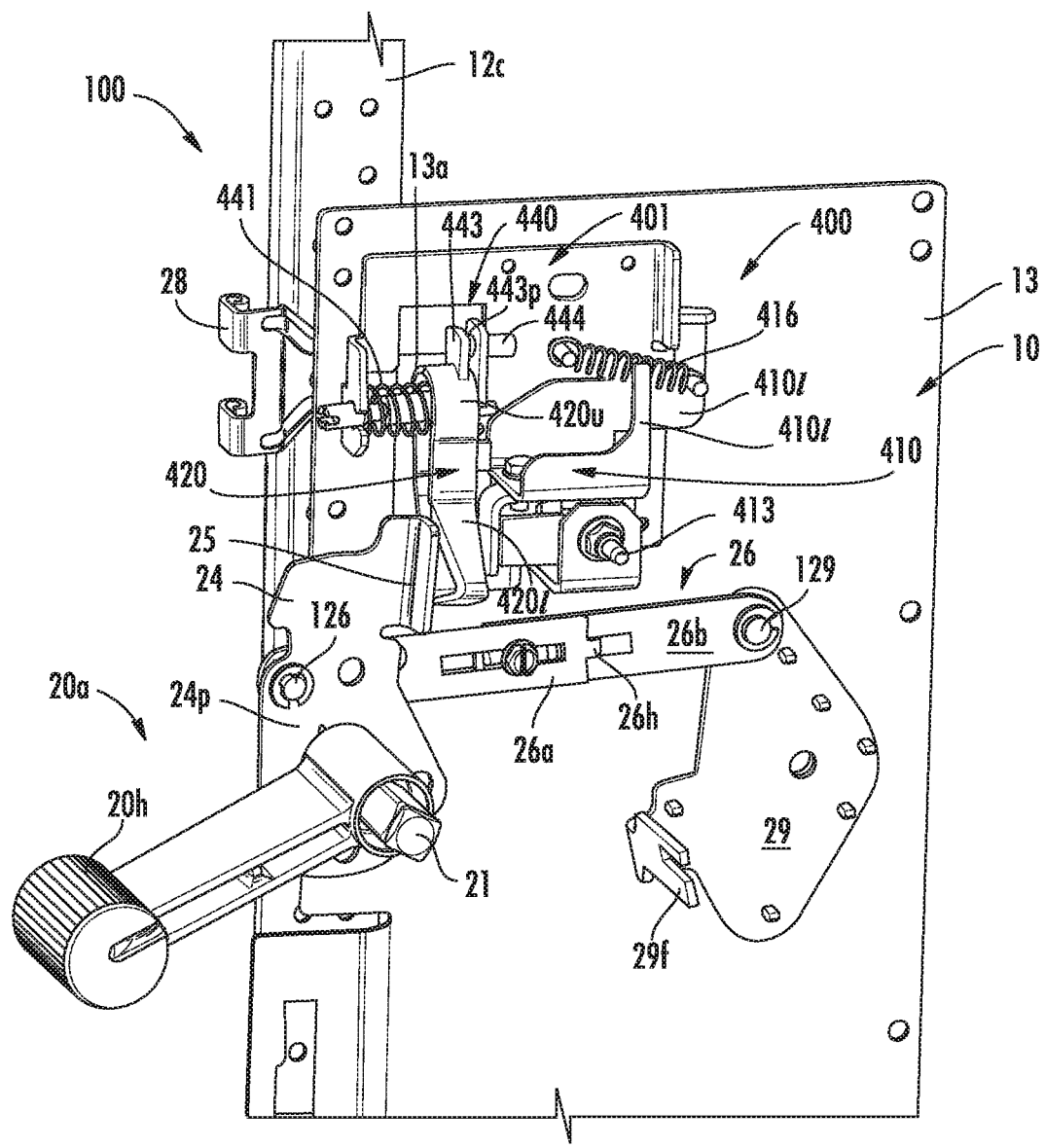
FIG. 6A is a side perspective partial view of a unit illustrating a power connector position interlock assembly with unit latch according to embodiments of the present invention.
Figure 6B:
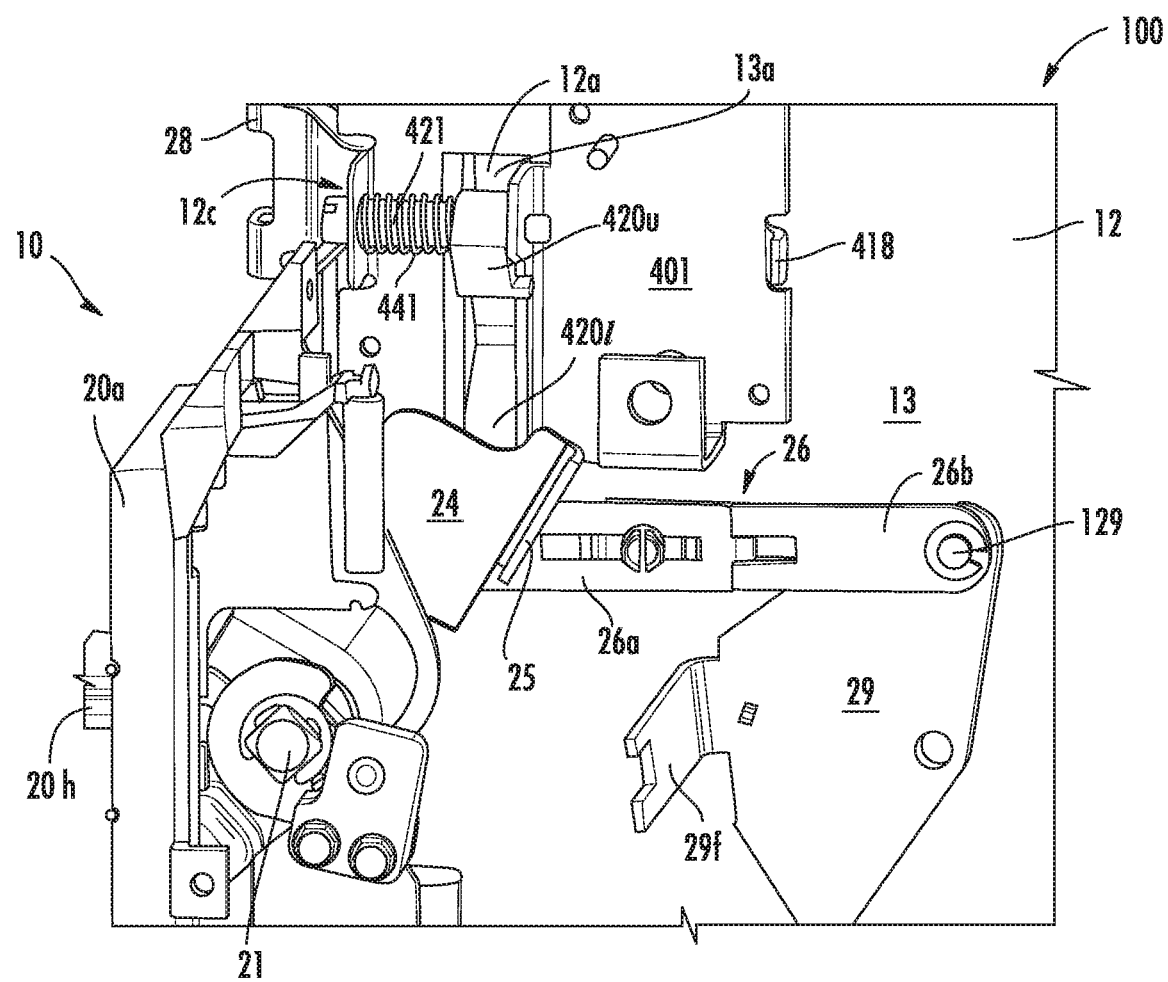
FIG. 6B is side perspective partial view of the unit shown in FIG. 6A with the unit latch shown without the power connector position interlock.

FIGS. 6A and 6B illustrate that the unit 10 can include a power connector position interlock assembly 400. The assembly 400 includes a power connector position interlock 410 and a unit latch 420. The unit sidewall 13 includes an aperture 13a that aligns with a corner post 12c of the MCC cabinet (housing/enclosure) 12. The enclosure can include an internal aperture 12a (which can be a cutout or region in one wall of the corner post) of the MCC housing/enclosure 12 to allow the latch to engage this structure to latch. The unit latch 420 can rotate in and out to latch and unlatch the handle 20h. The assembly 400 can include a mount bracket 401 that attaches to the sidewall 13 and positions the unit latch 420 in-line with the aperture 13a. The cabinet/enclosure 12 can include a corner post 12c and the aperture 12a can be in or adjacent the corner post 12c, typically inside the external wall of the enclosure.

The power connector position interlock 410 can include a pivot plate 412 attached to a laterally extending shaft 413 that is coupled to the sidewall 13 of the unit 10. The shaft 413 can reside behind and above the shaft 21 of the handle lever 20h. The power connector position interlock 410 can track the movement of the power connector assembly 200 (stabs S, i.e., power connectors 46, 48, 50, FIG. 7A). The power connector interlock 410 is connected to the carriage 202. The carriage 202 keys to the power connection position interlock 410 when stabs/power connectors 46, 48, 50 are in a power connected position with stabs extended, FIG. 7B. The pivot plate 412 can pivot up and down. When down, the pivot plate 412 can block the handle cam 24 (from rotation towards an On position) when the power connector assembly is in a retracted position (and can also be described as a "pivot block" of the interlock 410).

Figure 7D:
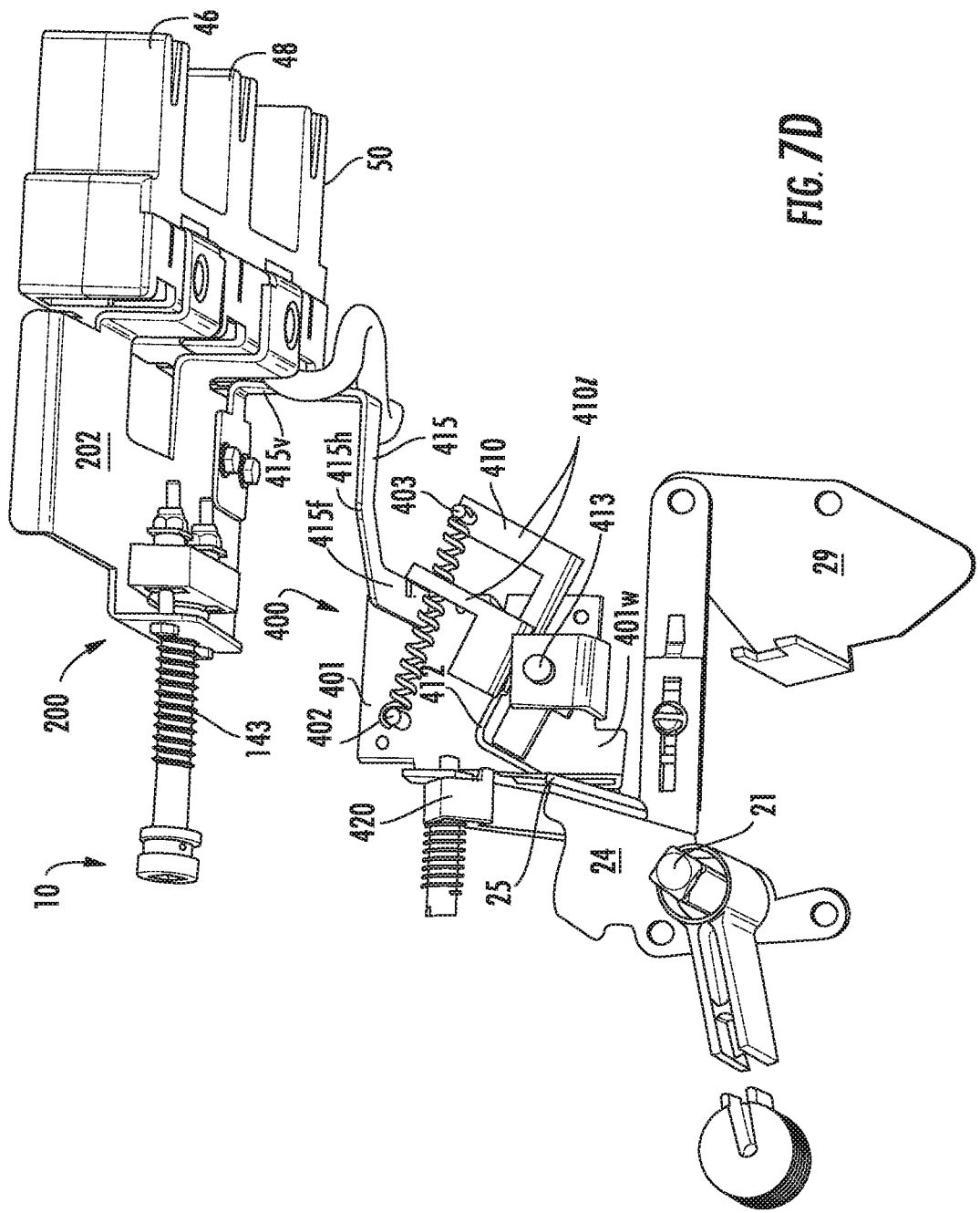
Figure 12A:
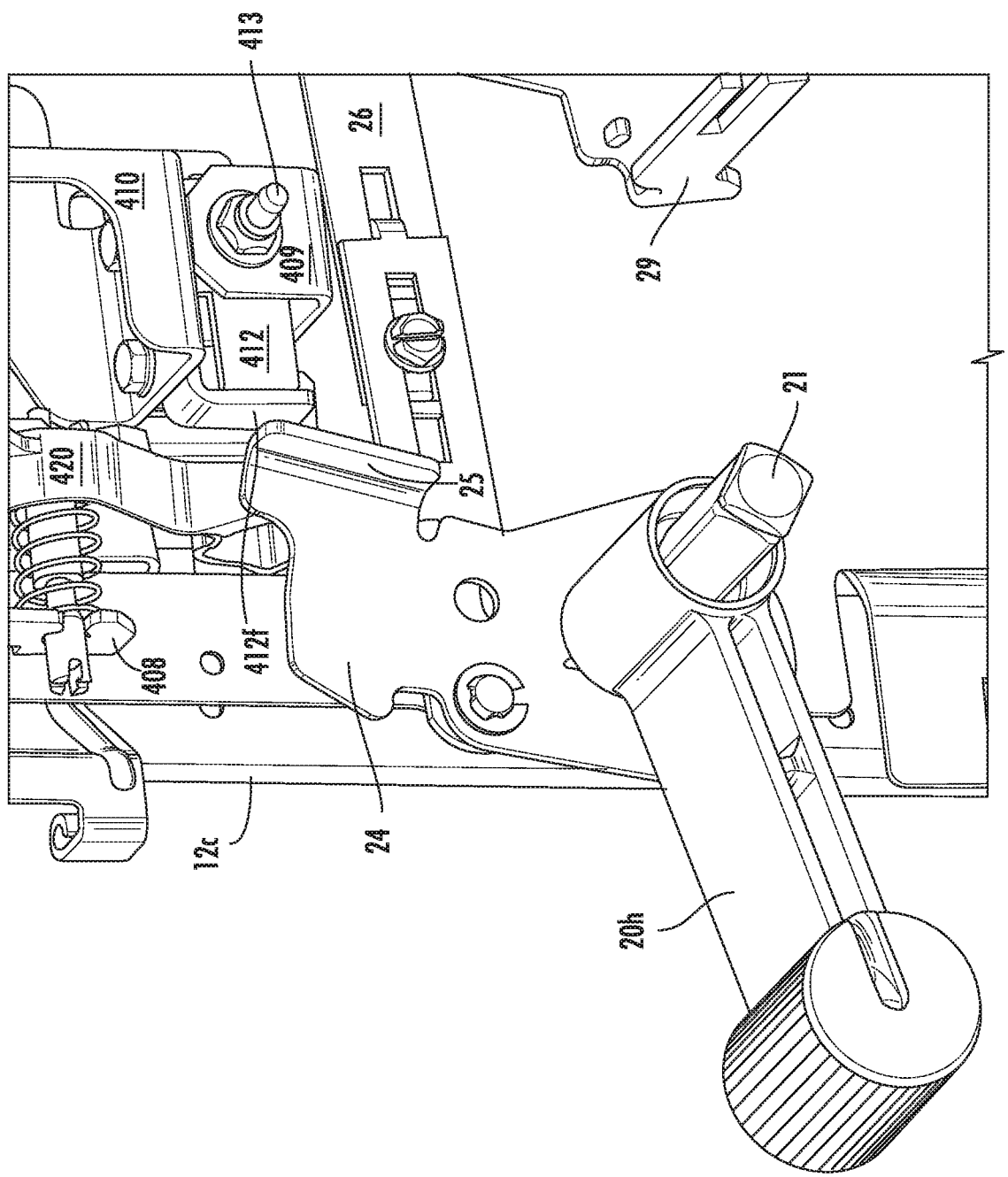
FIG. 12A is an enlarged partial side perspective view of a unit with the handle blocked by the power connector position interlock assembly when the power connectors are not extended according to embodiments of the present invention.

FIGS. 7C and 7D illustrate the carriage 202 of the power connector assembly 200 connected to a coupler 415 that can selectively engage the interlock 410 in a connected state associated with extension of the power connectors 46, 48, 50. As shown in FIGS. 7D and 12B, when the carriage 202 is in the extended position to extend the power connectors 46, 48, 50 (i.e., also known as contact bus bars or stabs) out of the back of the unit 10 to a power-connect state, the coupler 415 causes the power connector position interlock 410 to pivot up which releases the handle cam 24 and therefore does not block the handle 20h, allowing the handle 20h to rotate. FIGS. 7C and 12A illustrate that when the carriage 202 is retracted with the power connectors 46, 48, 50 in a disconnected state inside the unit 10, a front segment of the coupler 415 resides forward of the interlock 410, adjacent and above the unit latch 420, and the interlock 410 via pivot plate 412, blocks the handle cam 24 from rotation (towards an On position).

The power connector position interlock 410 can include first and second legs 410l that are spaced apart laterally and also in a front to back direction of the unit 10 and can reside above the pivot plate 412. The rear one of the legs 410l can be attached to a biasing member 416, such as a coil spring, that is attached to the mount bracket 401 of the interlock assembly 400. Inwardly spaced apart posts 402, 403 (spaced apart in the front to back direction) can hold the biasing member 416. The first post 402 can be stationary and held on a wall 401w of the mount bracket 401 (see also, FIGS. 18A, 18B). The first post 402 can reside above a bracket 409 held by the wall 401w (FIG. 18A) that holds the pivot plate 412 (FIGS. 7C, 7D). The second post 403 can be held by the second (rear) leg 410l of the interlock and can pivot with the interlock 410. The front one of the legs 410l can contact the coupler 415 when the power connectors 46, 48, 50 are extended (FIG. 7D).

Figure 13A:
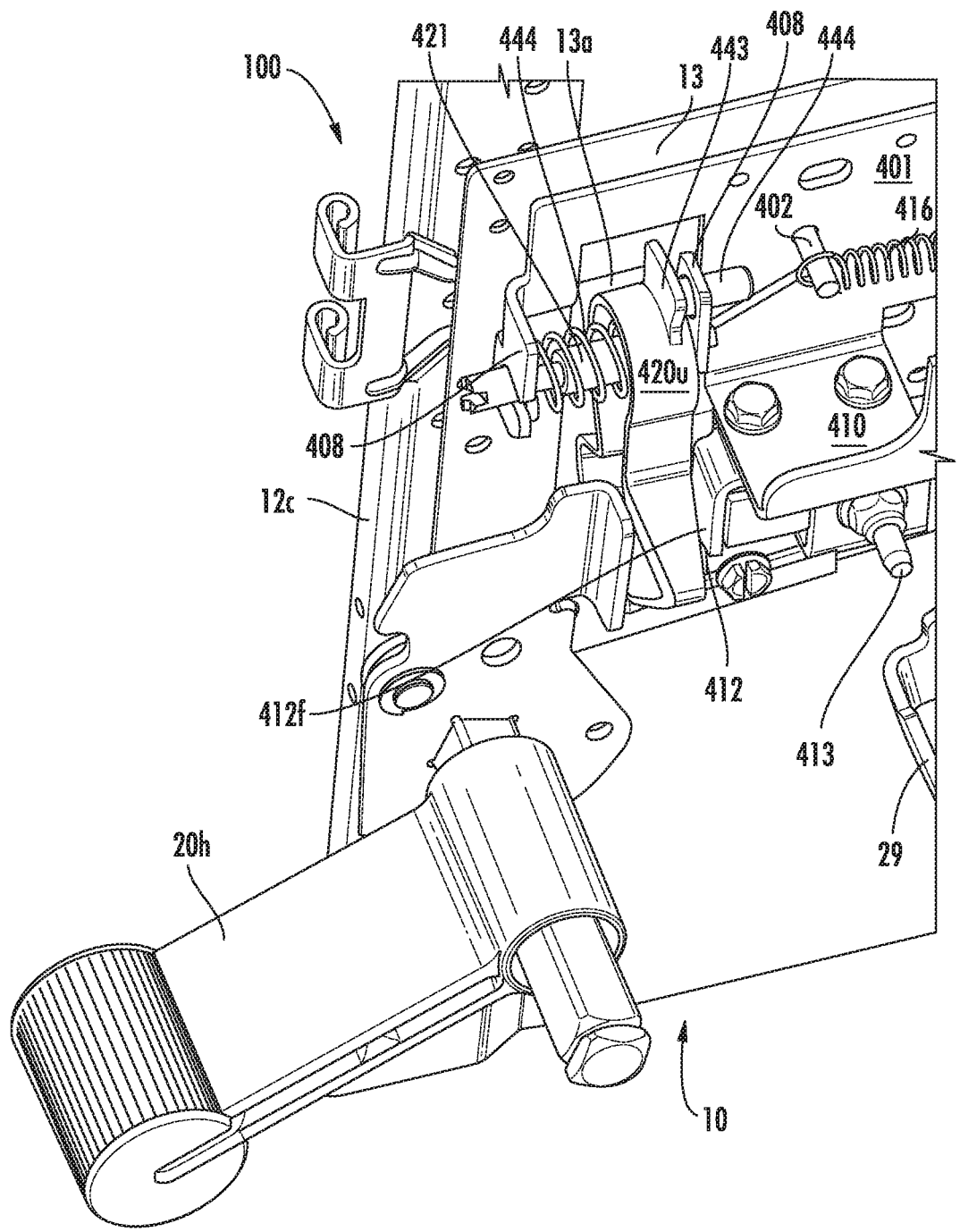
FIG. 13A is an enlarged partial side perspective view of a unit with the handle blocked (from rotation towards an On position) by the unit latch when the unit latch is not engaged according to embodiments of the present invention.

The pivot plate 412 can have a front segment 412f that resides in front of the shaft 413 and that can be vertical or substantially vertical in the block configuration associated with the non-extended position of the connector assembly 200 which may be termed a "home" position (FIGS. 7C, 12A, 13A).

The mount bracket 401 can include a travel stop feature 418 as shown in FIGS. 6B and 7C and the rear leg 410l of the power connection position interlock 410 can abut this travel stop feature 418 in the power connector retracted position (FIG. 7C) for the travel stop for the biased "home" position of the power connector position interlock 410.

Referring again to FIGS. 6A and 6B, the unit latch 420 can be a pendulum latch that is pivotably held by an inwardly extending shaft 421 that is held by the mounting plate 401 that is held by the sidewall 13. The shaft 421 of the unit latch 420 can be held on support flanges 408 that project inwardly from the mount bracket wall 401w. The unit latch shaft 421 can be held orthogonal to the shaft 21 of the handle lever 20h and/or the shaft 413 of the power connector position interlock 410. The unit latch 420 can include an upper end portion 420u and a lower end portion 420l. The upper end portion 420u can be held by the shaft 421 and the lower portion can be a free end that can have a larger size and a different shape than the upper portion 420u. The lower end portion 420l can cooperate with a laterally inwardly extending ledge 25 of the cam 24 attached to the shaft 21 of the handle lever 20h. The upper portion 420u can be held by the shaft 421 to pivot in and out between unlatched and latched positions.

The shaft 421 can be spring loaded in an axial direction (perpendicular to the shaft 21 of the handle 20h) via spring 441 as shown in FIG. 6B, for example. The spring 441 can be held between the shaft flanges $408_1$ and a recess 420r in the unit latch 420 (FIGS. 12B, 13A) and may be attached to the shaft 421 or unit latch 420 via e-clips or other suitable attachment members or features or may free float between the shaft flanges 408 (typically in an axially compressed configuration).

Figure 4D:
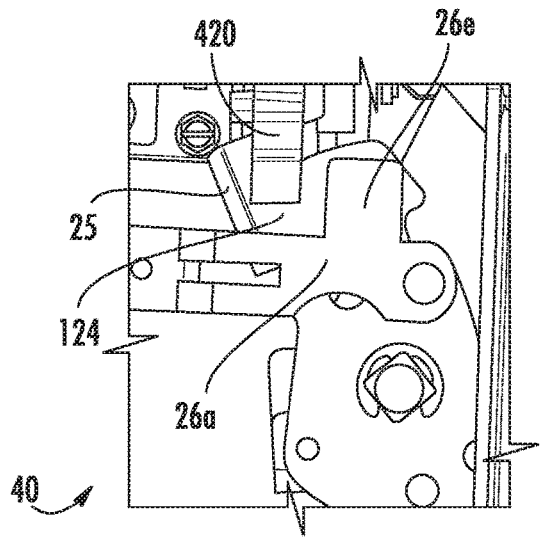
FIGS. 4D and 4E are partial side perspective views of the handle assembly shown in FIG. 3 with an extension on the link to cooperate with the handle cam according to embodiments of the present invention.
Figure 4E:
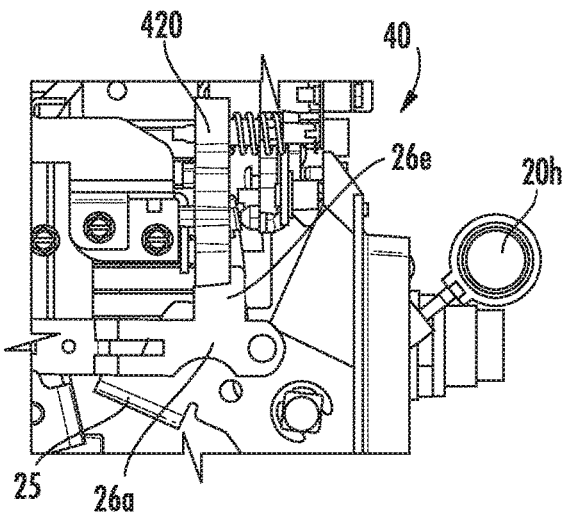

Referring to FIGS. 4D and 4E, the unit latch 420 can be prevented from being rotated from the latched to the unlatched position when the breaker is ON. The unit latch 420 can be blocked by a surface 124 of the handle cam 24, depending upon the position of the handle lever 20h as it rotates from Off towards the On position. As the handle 20h begins to rotate from the Off towards the On position (FIG. 4E), the unit latch 420 can be blocked by an extension 26e on the link 26a to prevent the unit latch 420 from rotation to the unlatched position.

As will be discussed further below, as shown in FIG. 6A, the unit latch 420 can be in communication with a detent sub-assembly 440 to provide latch reinforcement to inhibit unintentional unlatching of the latch 420 due to its weight and/or shock or vibration forces of the handle 20h during operation. The detent sub-assembly 440 can comprise the spring 441 that is held by the shaft 421 and that is coupled to a detent member 444 via a flange 443 with at least one inner facing pocket 443p (FIGS. 13B, 17B, 17C) to provide a spring-loaded detent 444. The term "detent" refers to a positional detent or preferential "stop" position associated with a latch and/or unlatched position. The detent sub-assembly 440 can optionally also provide tactile feedback to a user upon turning the latch in an operative turn amount placing the detent member into a pocket 443p (FIGS. 13B, 17B, 17C), such as about a quarter (¼) turn or about a one eighth (⅛) turn, to secure the unit 10 to the cabinet 12 of the MCC for tactile feedback confirmation of the proper movement of the latch in one or both bi-stable states. The tactile feedback can be provided in a single direction, i.e., a positive latch tactile feedback (single pocket) or both directions (dual pockets), latch and unlatch tactile feedback.

The detent member 444 can be provided by any suitable member such as, for example, a shaped projection 444p in the (metallic) wall 408w of the shaft flange 408₂ (FIGS. 16B, 18B) or a ball bearing 444b, which can be a axially spring-loaded ball bearing, held by the shaft flange 408₂ (FIGS. 12B and 13A, for example). The detent member 444 can slidably extend into and out of at least one pocket 443p in the latch flange 443 as the unit latch 420 rotates to lock into a latch position and/or an unlatched position to provide a hold force in an axial direction of the shaft 421 as will be discussed further below. It is noted that the detent member 444 may alternatively be held on the latch flange 443 and the cooperating pocket(s) 443p can be held on the unit latch shaft flange 408₂ (FIG. 16C).

FIG. 7A shows a partially retracted position of the stabs S, i.e., power connectors 46, 48, 50, and FIG. 7B illustrates a fully extended position to illustrate the operation of extending the power connectors 46, 48, 50. A lead screw 143 with a socket 143s is rotated clockwise which drives a nut 147 which is part of the assembly 200 that contains the power connectors 46, 48, 50 In the retracted position, the connectors 46, 48, 50 are not in contact with the bus bars (not shown). If the lead screw 143 with threaded shaft 143t and socket 143s continues to be rotated clockwise the power connectors 46, 48, 50 will eventually come into contact with the bus bars (not shown) when fully extended (FIG. 7B).

As discussed above, FIGS. 7C and 7D illustrate the carriage 202 of the power connector assembly 200 can be connected to a coupler 415 that can selectively engage the interlock 410 in a connected state associated with extension of the power connectors 46, 48, 50. The coupler 415 can have a vertical segment 415v that merges into a horizontal segment 415h that extends toward the front of the unit and that merges into a front segment 415f that extends laterally a distance. The horizontal segment 415h can have a length that is greater than the length of the front segment 415f. The horizontal segment 415h can have a length sufficient to place the front segment 415f in front of the inner shaft flange 408 when the power connectors are retracted (FIG. 7C). The front segment 415f can have a length that is between 1-4 inches.

Figure 8:
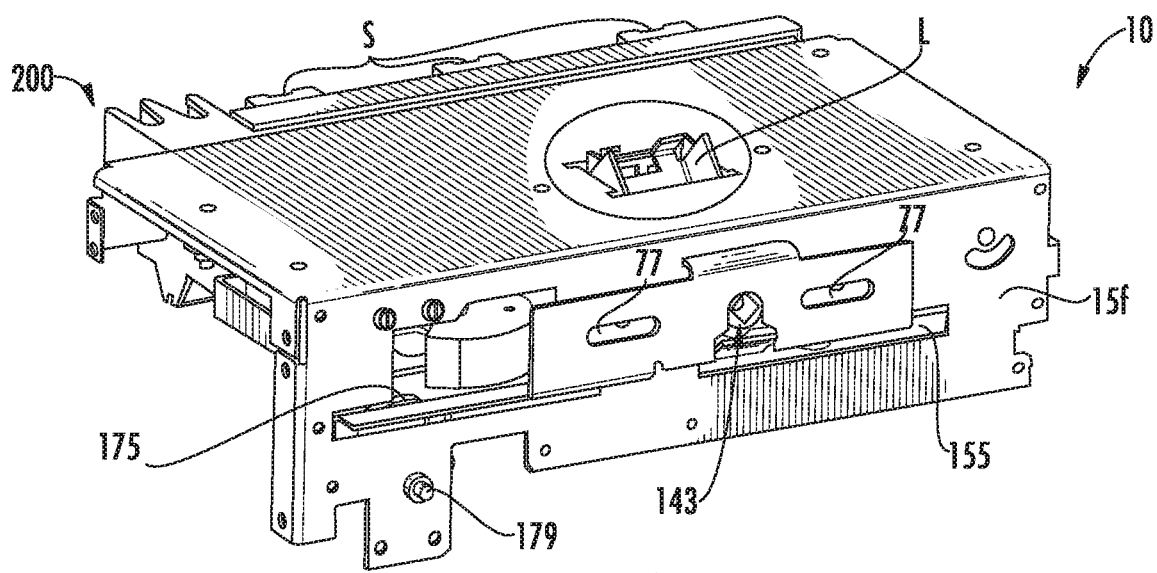
FIGS. 8 and 9 are front, side perspective views of a portion of a unit with a sliding shutter according to embodiments of the present invention.
Figure 9:
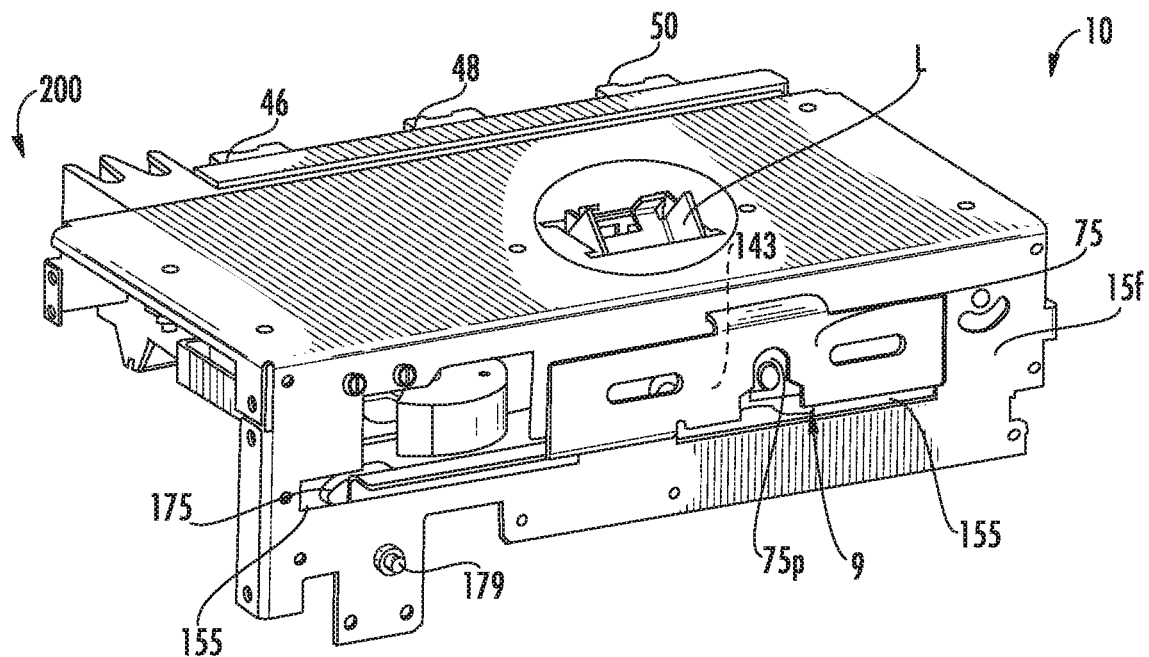

Referring to FIGS. 8 and 9, for example. The sliding shutter 75 provides a safety interlock to prevent the operator from accessing the lead screw socket 143s when the breaker 30 is in the ON state. When the disconnect switch assembly 30 (i.e., breaker) is in the OFF state, the shutter 75 positions the shutter portal 75p over the socket 143s and permits access to the socket 143s as shown in FIG. 8. When the disconnect switch assembly 30 (i.e., breaker) is in the ON position, the shutter 75 slides to the right to a closed position which blocks access to the lead screw 143 and socket 143 as shown in FIG. 9 (shown as slid in one direction but the opposing sliding direction may be used to block access with the shutter portal 75p).

FIGS. 8 and 9 illustrate that the shutter 75 can be parallel to the partial front wall 15f. The lead screw 143 can extend out of an aperture in the partial front wall 15f. The partial front wall 15f can have at least one horizontally extending gap space or slot 155 that allows the shutter 75 to slide right and left in response to rotation of a shutter cam 175 (FIGS. 9, 10A, 10B, 11). The shutter cam 175 can slidably attach to the partial front panel 15f and be in communication with at least one laterally slidable shutter 75 with a portal 175p. When the portal 75p is aligned with the isolation portal 43 (FIG. 2) and an internal lead screw 143 with a socket (FIGS. 7A, 7B), external access to the portal 43 and the lead screw with socket 143 is allowed.

Figure 10A:
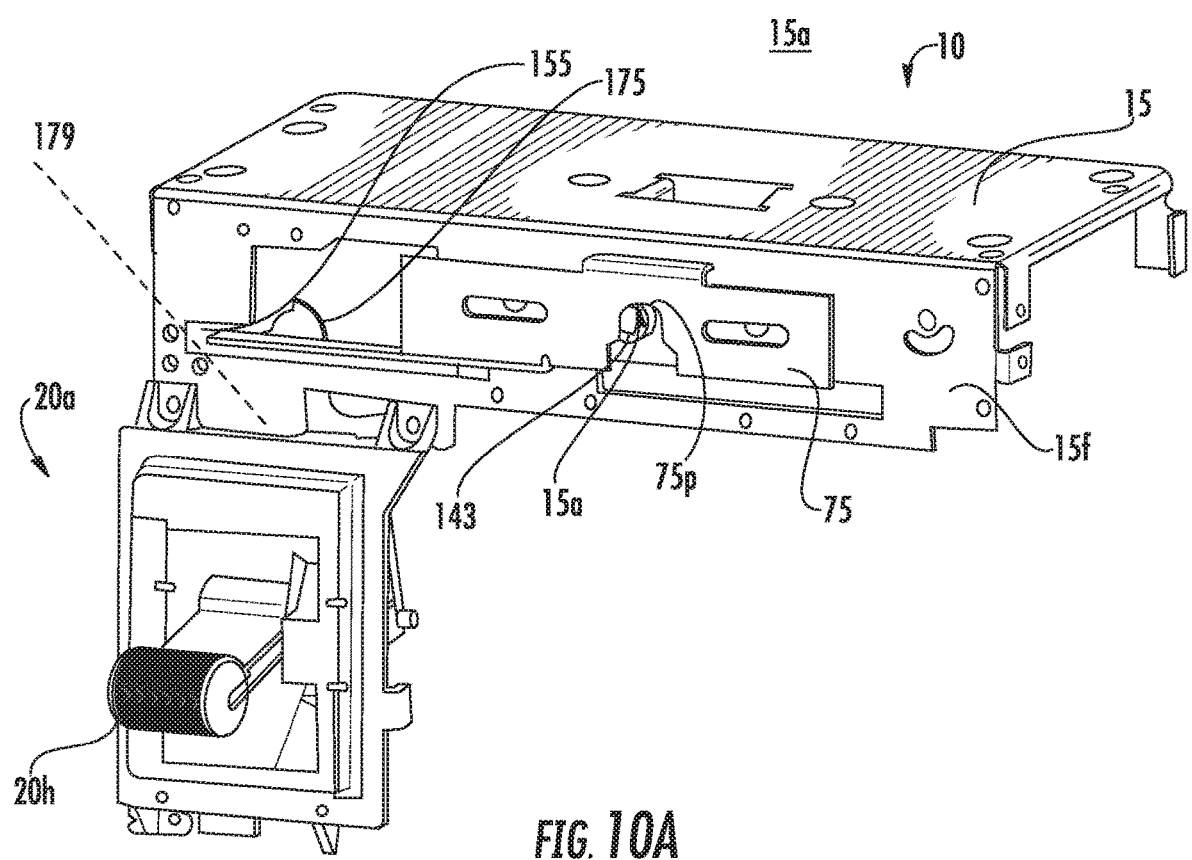
FIG. 10A is a front perspective view of a portion of a unit showing a sliding shutter and a vertically operational handle lever according to embodiments of the present invention.
Figure 10B:
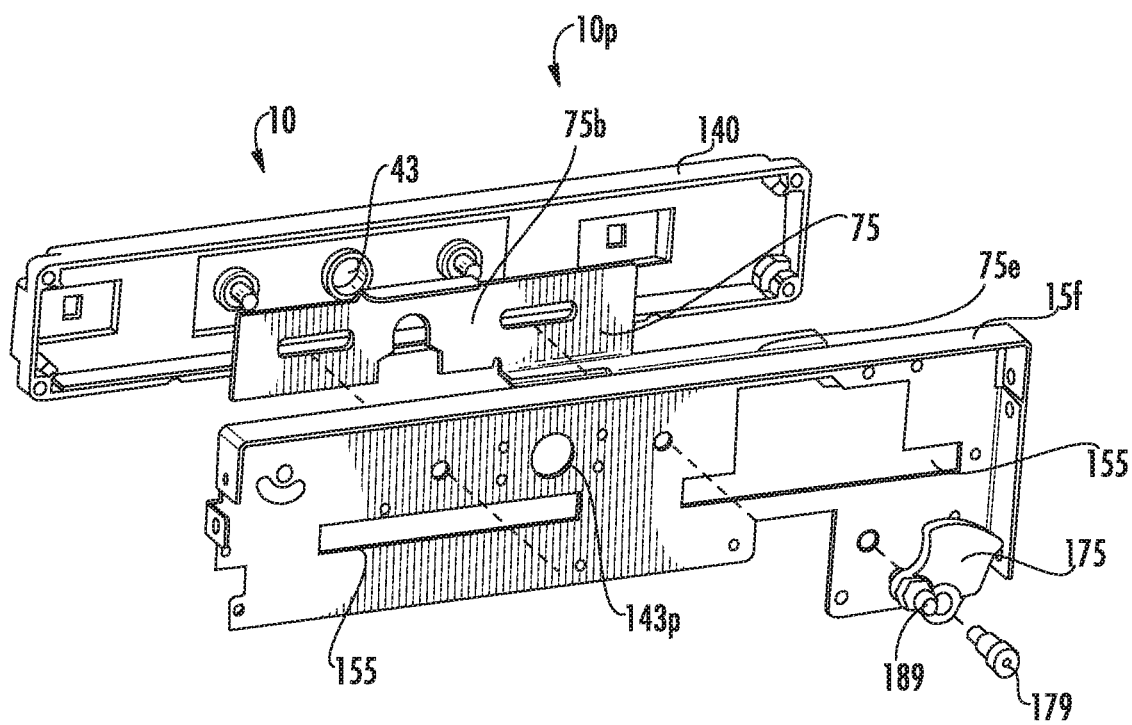
FIG. 10B is a partial back perspective exploded view of a top plate assembly for the unit shown in FIG. 10A according to embodiments of the present invention.

FIG. 10B shows a top plate sub-assembly 10p with the shutter cam 175 attached to the partial front wall 15f, which is behind the shutter 75, which is behind a front cover panel 140 with an external access portal 43. The shutter cam 175 is shown with the upper attachment member 189 can extend horizontally outward behind the partial front wall 15f and shutter cam 175 in this embodiment.

Figure 11:
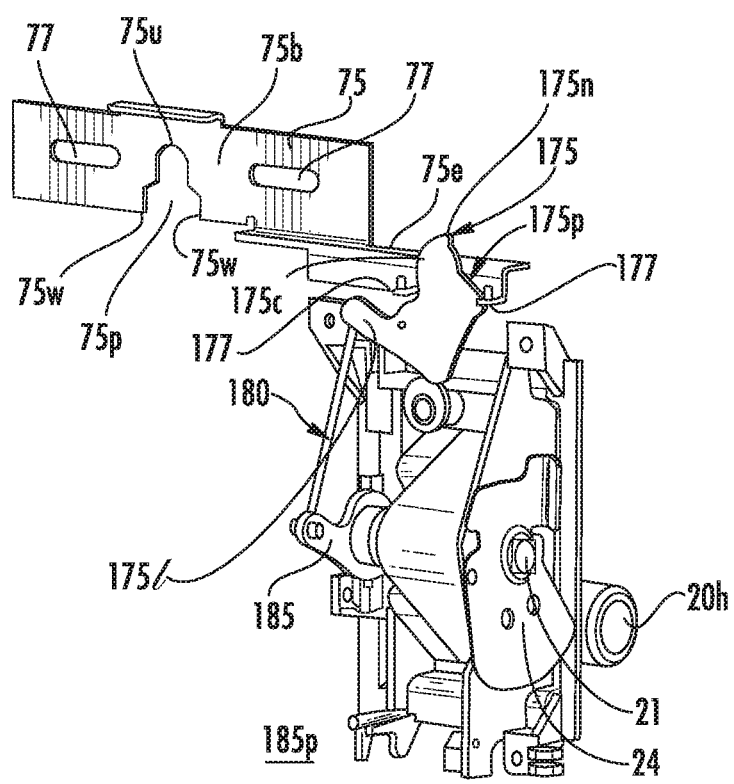
FIG. 11 is a rear side perspective view of a shutter assembly according to embodiments of the present invention.

An example rear view of the handle 20h and shutter 75 in the OFF state is shown in FIG. 11. The position of the shutter 75 is controlled by the position of the handle lever 20h by a shutter linkage 180 that drives a rotating shutter cam 175. As the handle lever 20h rotates, the linkage 180 pulls or pushes the shutter cam 175 which rotates and contacts one of the right or left shutter tabs 177 as shown in FIG. 11. Depending upon the shutter cam 175 rotation direction, the shutter 75 is pushed towards either the open or closed position (left or right). The shutter linkage 180 can comprise a straight rod or pin and can be attached to a handle link 185, such as a planar clamp or other link segment or member attached to the handle shaft 21.

The lower end portion of the shutter linkage 180 can be attached to a handle assembly link 185. The handle assembly link 185 can project inward a distance on one side of the shaft 21 (opposite the side holding the cam 24 that engages the linkage 26) and each can reside on opposing end portions of the shaft 21. The shutter cam 175 can be parallel to the primary body 75b of the shutter 75 that holds the portal 75p. The shutter cam 175 can have a leg 175l that is attached to the upper end of the handle assembly linkage 180. The handle assembly linkage 180 can be a plate or planar shaped member.

The shutter cam 175 can be attached to the downwardly extending partial front wall 15f (FIGS. 3, 9, 10B) via at least one attachment member 179 that allows the pivoting/rotation motion of the shutter cam 175. The attachment member 179 can be a shoulder screw, for example. The attachment member 179 can attach the shutter cam 175 to the partial front wall segment 15f at a position that is below the shutter 75 and to one side of the shutter portal 175p.

The shutter 75 can have at least one lateral extension 75e that extends off a respective side of the shutter primary body 75b (shown as the left side (when looking from the front of the unit) in FIGS. 10B and 11). The extension 75e can comprise laterally spaced apart tabs 177 that can serially engage different perimeter segments of the shutter cam 175 to move the shutter 75 right and left. The extension can have a height that is much less (50% to 90% less) than the height of the primary body 75b and may extend a distance below the primary body 75b as shown. The tabs 177 are shown as extending inward into the unit and the shutter cam 175 is shown as residing behind the shutter 75 but other arrangements can be used. For example, the shutter 75 or extension thereof 75e can reside in back of the shutter cam 175 and the tabs 177 can project forward.

The shutter cam 175 can be planar and extend parallel to the primary body of the shutter 75.

Referring to FIG. 11, the shutter portal 75p can have an arcuate upper end portion 75u that merges into a wider open space at a bottom thereof and the perimeter shape of the portal may have sidewalls 75w that are parallel and straight at the bottom end portion under the arcuate upper portion. The shutter may include elongate horizontal slots 77 that face slots 155 in the front partial wall 15f.

Still referring to FIG. 11, the shutter cam 175 can be a plate 175p that is parallel to the primary body 75b of the shutter 75. The plate 175p can be planar and can have a cam perimeter profile that is curvilinear. As shown, in some particular embodiments, the cam perimeter profile comprises an upper portion with a curved segment 175c with a radius of curvature "R" and a spaced apart peak or node segment 175n. The curved segment 175c can have an angular extension α of about 15-180 degrees measured from a center defining a radius of curvature for an arc, more typically between about 20-135 degrees, in some embodiments. The curved and the peak or node segments 175c, 175n can both reside above the tabs 177 and/or above the segment that is attached to the linkage 180. However, it is contemplated that other cam perimeter profiles and attachment configurations may be used and that the leg is not required.

In some embodiments, the unit/bucket assembly 10 can comprise a molded case circuit breaker as the disconnect switch assembly 30. Molded case circuit breakers are well known to those of skill in the art, as exemplified by U.S. Pat. Nos. 4,503,408 and 5,910,760, the contents of which are incorporated herein by reference as if recited in full herein. In other embodiments, the bucket assembly 10 can be configured to house a fused disconnect switch to turn power on and off.

As shown in FIG. 8, for example, the unit 10 can be configured so that the stab S is offset to reside closer to one side of the unit, e.g., so that a left side stab 46 or right side stab 50 (and/or the center stab 48) is closer to a respective left or right side of the unit 10. FIGS. 7 and 8 show the center stab 48 as residing closer to the right side of the unit 10, according to some embodiments. FIGS. 8 and 9 also illustrate that, as conventional, the unit 10 can have an interlock L typically via the top surface of the unit.

FIG. 4A illustrates an exemplary "OFF" orientation/position of the handle 20h and lever 35 (shown as both in a down position) while FIG. 4B illustrates an exemplary "ON" position of the handle 20h and lever 35 (shown as in a pivoted up position). The reverse orientations of ON and OFF may also be used. In operation, the pre-defined orientation of the handle 20h with respect to operation status can provide a visual indication to a user-operator of the conduction status of the disconnect circuit assembly 30, e.g., breaker or switch disconnect (optionally with a fuse) being ON/OFF.

The term "ON" with respect to handle position/orientation refers to the associated feeder or starter of the unit 10 having conduction with the operator disconnect closed (circuit breaker closed or fused switch being ON/switch closed). The term "OFF" with respect to handle position/orientation refers to the associated feeder or starter of the unit 10 having no conduction with the disconnect open (circuit breaker open or disconnect switch OFF/switch open).

The lateral stroke distance of the shutter 75 and/or the shutter extension 75e in each direction, right to left and/or left to right to open/close the access path to the lead screw 143 can be between about 0.25 inches to about 3 inches, more typically between about 1 inch to about 2 inches.

In some embodiments, the unit 10 can be a dual starter and/or feeder unit and the shutter 75 can engage two handles 20h in a single unit 10, and each handle may have a dedicated shutter cam 175, 175' that cooperates with the shutter 75. In some embodiments, two or more separate shutters 75 may be provided, such as one for each handle 20h. For example, if the unit is a dual unit, a single shutter can be used. However, if two shutters are used, one can reside in front of the other and independently slide right and left in response to respective handle position 20h). In other embodiments, the two shutters can reside in the same plane and laterally move to provide the access and blocking configurations.

For fused switch disconnects, the operator mechanism 40 can engage and move a fuse switch lever 35, up and down for ON/OFF operation. Exemplary fuses are FUSETRON™ 600V Class RK5 fuses (BU-SB13729) available from Cooper Bussmann Company, St. Louis, Mo. However, the design is flexible and can accommodate other fuses including those in different classes.

Figure 13B:
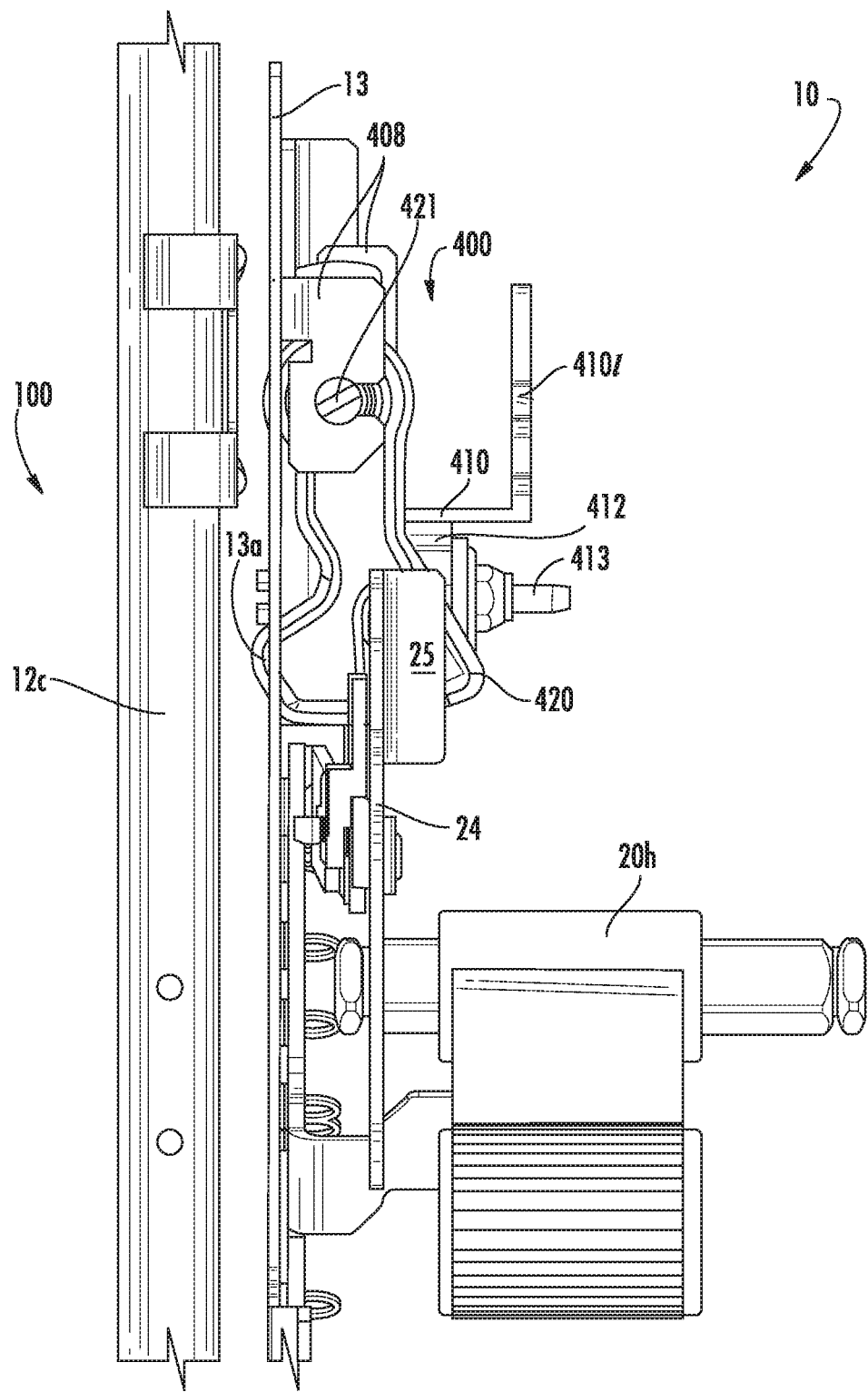
FIG. 13B is a front partial view of the unit with the unit latch not engaged and the handle blocked (from rotation towards an On position) according to embodiments of the present invention.

Referring to FIGS. 13A and 13B, as shown, when the unit latch 420 is not engaged (i.e., is disengaged from the cabinet 12 of the MCC 100), the handle 20h is blocked from movement by the unit latch 420. In this position, the inwardly laterally extending ledge 25 is pivoted to an inward stop position, away from the sidewall 13 of the unit 10 and abuts a lower portion 420l of the unit latch 420 preventing rotation of the handle 20h.

Figure 14A:
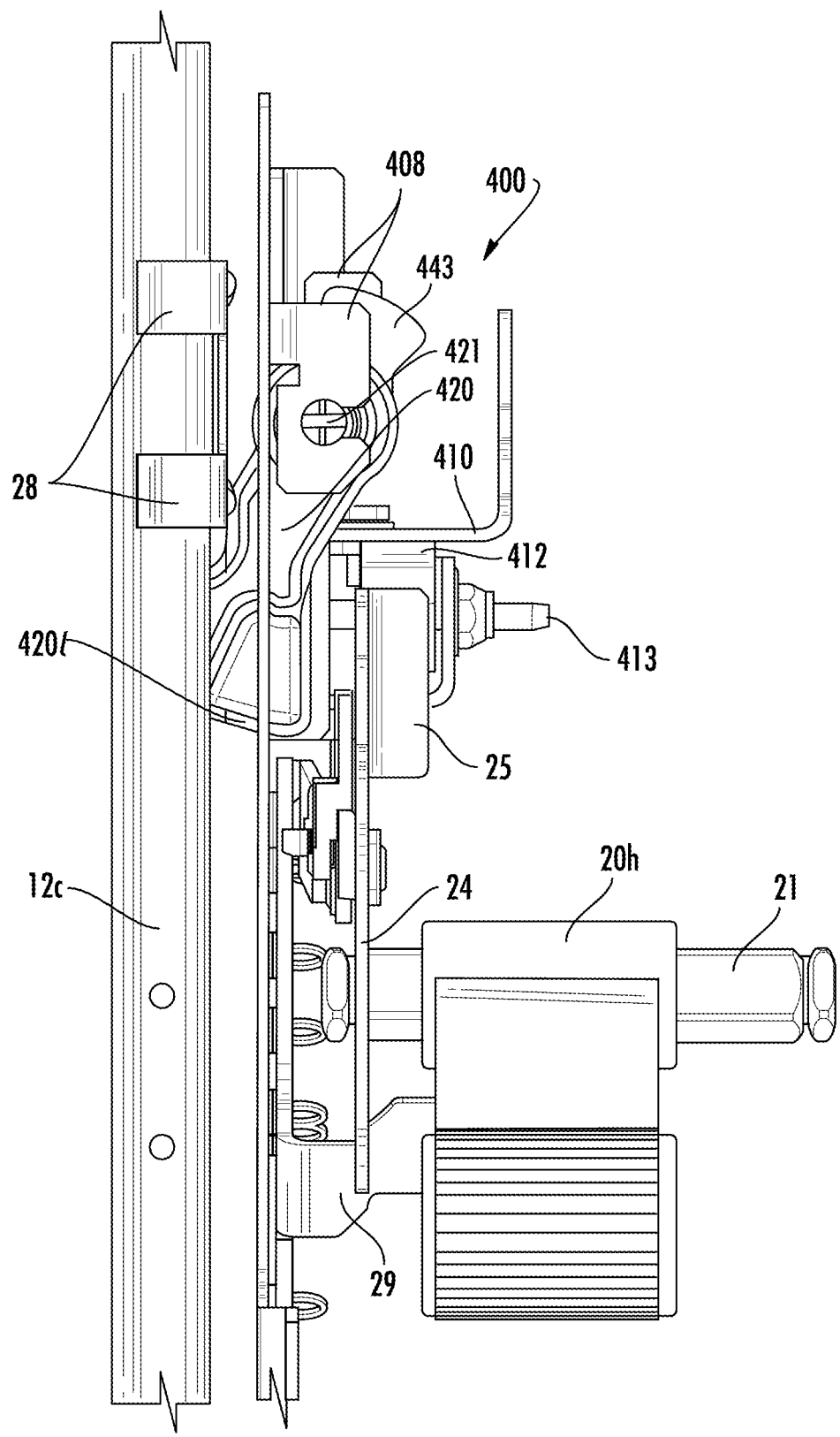
FIG. 14A is a front partial view of the unit with the unit latch engaged according to embodiments of the present invention.
Figure 14B:
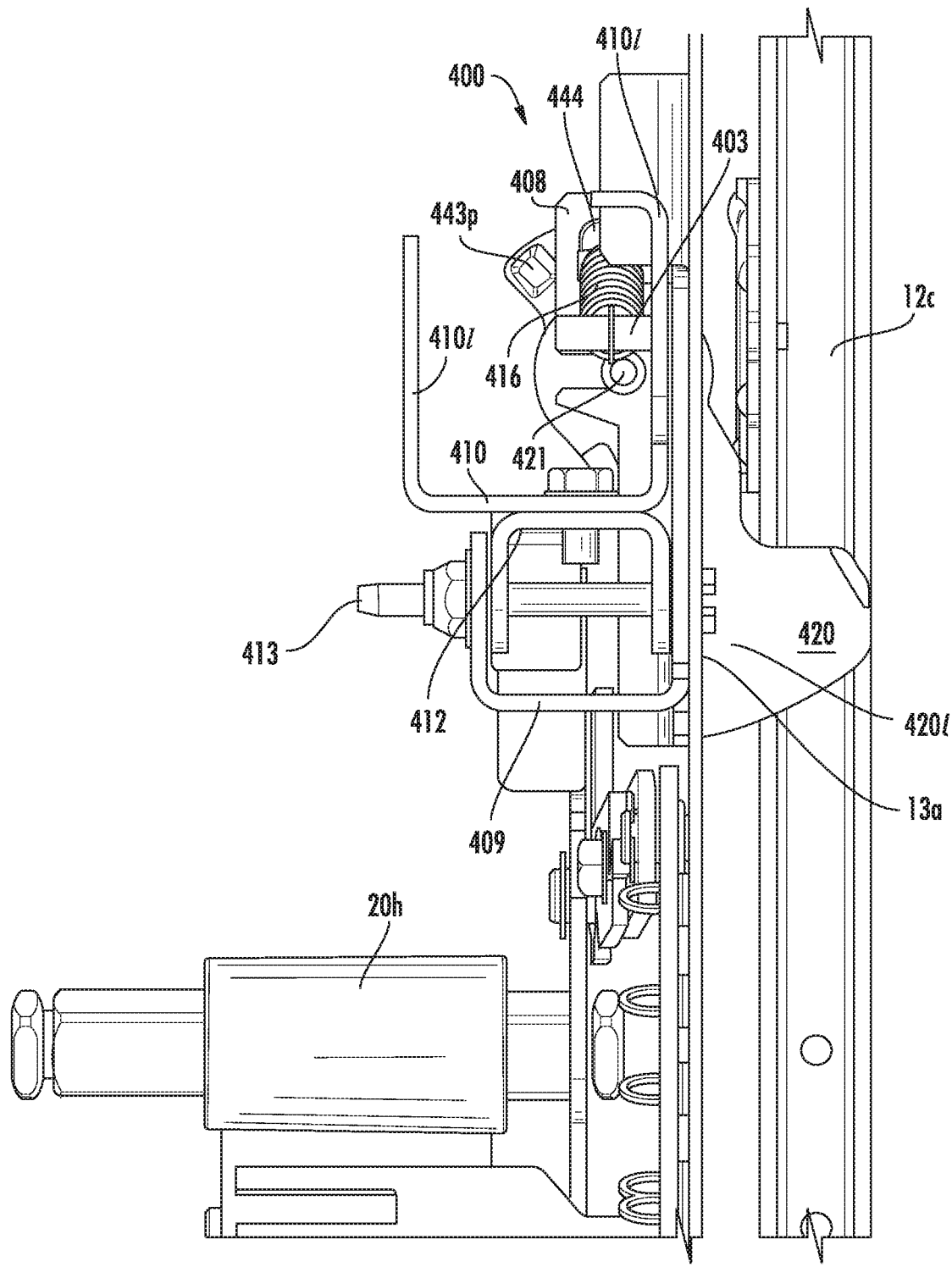
FIG. 14B is a rear partial view of the unit with the unit latch engaged according to embodiments of the present invention.

Referring to FIGS. 14A and 14B, when the unit latch 420 is engaged, with the lower portion 420l extending out of the unit sidewall 13 to reside adjacent or behind the corner post 12c of the cabinet/enclosure 12, the unit latch 420 no longer blocks the ledge 25 of the handle cam 24 and the handle clears the unit latch and is free to rotate, but only if the position interlock 410 is also in the appropriate position to allow this action.

Thus, the interlock assembly 400 with the mount bracket 401 provides an adjacent dual interlock configuration, one based on the latch or unlatched condition of the unit with respect to the enclosure 12 and one based on the position of the power connector assembly 200, and both can use the same handle cam interface 25. The interlock members 410, 420 can be held closely spaced apart, front to back, one in front of the other, when in a respective handle block position.

Figure 15A:
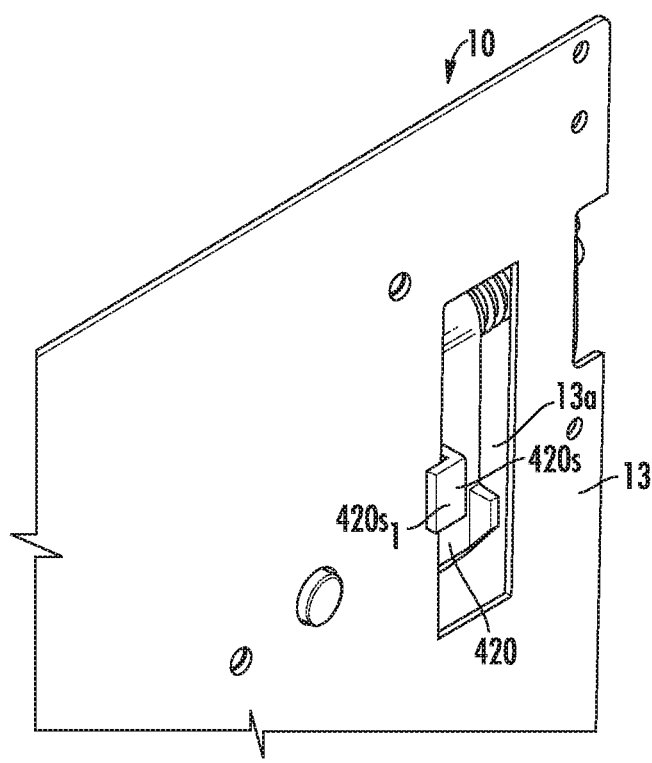
FIGS. 15A and 15B are enlarged side perspective views of the unit latch illustrating inbound and outbound travel stops according to embodiments of the present invention.
Figure 15B:
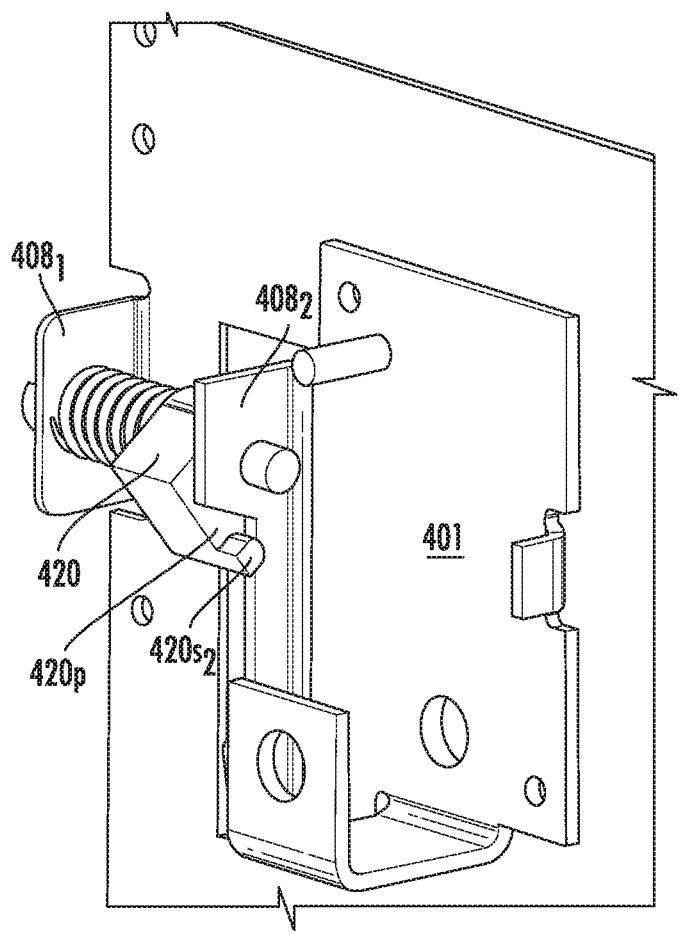
Figure 17A:
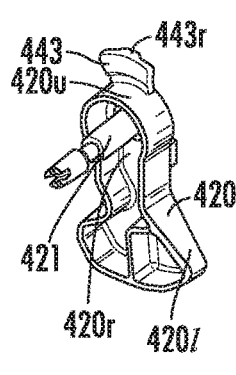
FIG. 17A is a front, side perspective view of a unit latch according to embodiments of the present invention.
Figure 17B:
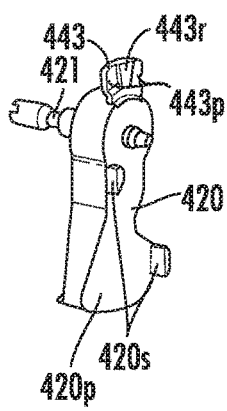
FIG. 17B is a back, side perspective view of the unit latch shown in FIG. 17A.

FIGS. 15A, 15B and 17B, for example, illustrate that the unit latch 420 can include travel stops 420s. The travel stops can be an inbound travel stop $420s_1$ (FIG. 15A) and an outbound travel stop $420s_2$. The travel stops 420s can reside on a common planar surface 420p facing the inner unit latch shaft flange $408_2$.

FIGS. 17A-17E illustrate an exemplary unit latch 420 which may be a monolithic single piece member that has an integrated shaft 421, a recess 420r and a flange 443 with at least one pocket 443p. In some embodiments, the flange 443 comprises first and second pockets $443p_1$, $443p_2$ that are spaced apart in a right to left direction when mounted to the unit 10.

Referring to FIGS. 16A, 16B, 17A-17C, and 17E, the flange 443 can have a raised wall segment 443r (i.e., increased wall thickness) between the pockets $443p_1$, $443p_2$. FIG. 16C illustrates that the flange 443 can comprise the detent member 444 and the latch flange $408_2$ can comprise the at least one pocket 443p.

Figure 16A:
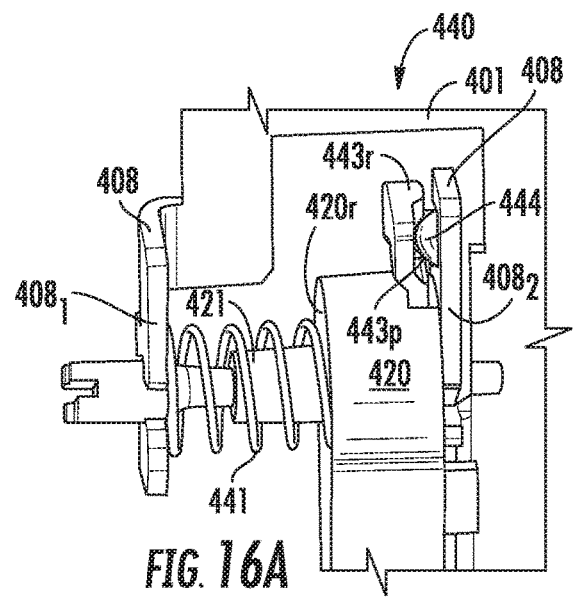
FIG. 16A is a side, perspective view of a portion of a unit latch assembly with a detent sub-assembly according to embodiments of the present invention.
Figure 16B:
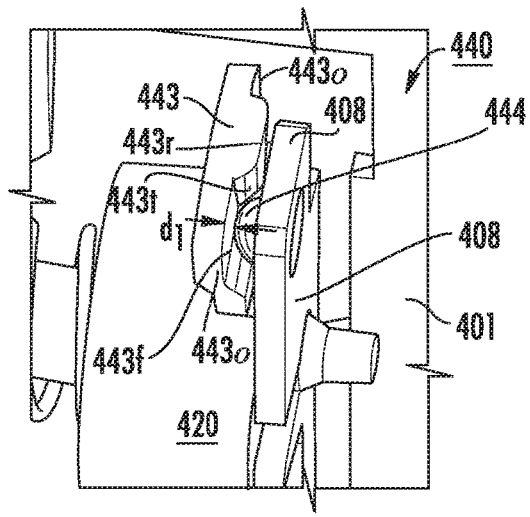
FIG. 16B is a top, side perspective view of the unit latch assembly shown in FIG. 16A.
Figure 16C:
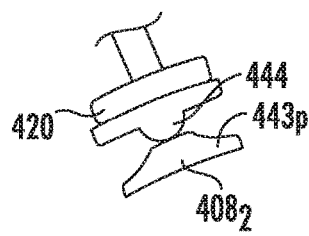
FIG. 16C is a top view of an alternate embodiment of the unit latch assembly shown in FIG. 16B according to embodiments of the present invention.
Figure 17C:
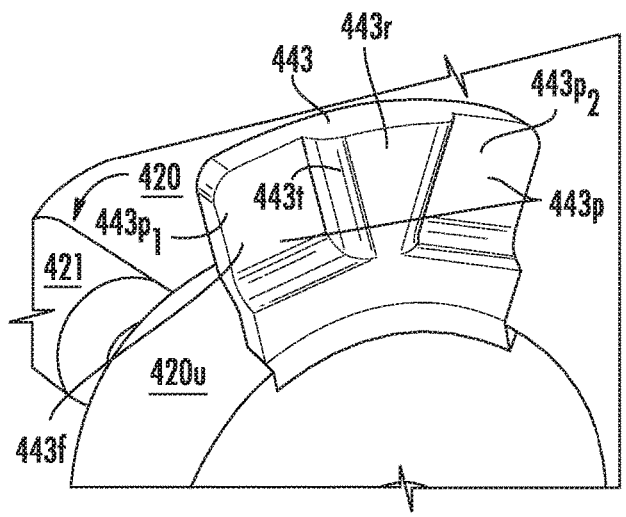
FIG. 17C is a greatly enlarged back view of the upper portion of the unit latch shown in FIG. 17B.

Referring to FIGS. 16B and 17C, the at least one pocket 443p can have a tapered inner wall 443t that merges down to a floor surface 443f and which can extend to the outer edge thereof 443o (without raising to form an outer wall boundary). That is, the floor 443f can have a constant depth extending to the outer ends of the flange 443. There can be a nominal clearance $d_1$ between the detent member 444 and the floor 443f of the pocket of the flange 443 of the unit latch 420 when the unit latch 420 is at either end of its travel as shown in FIG. 16B, for example. The nominal clearance can be between about 0.010 and 0.020, such as about 0.016, in some embodiments.

Figure 17E:
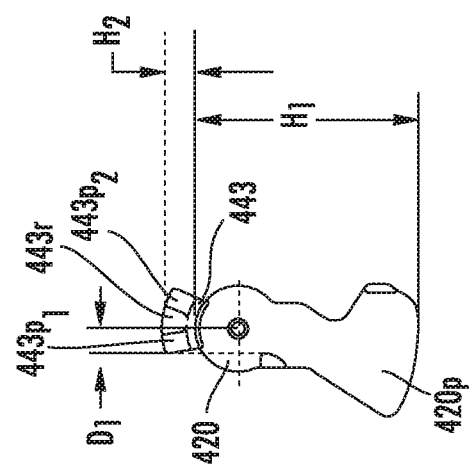
FIG. 17E is a back view of the unit latch shown in FIG. 17A.
Figure 17D:
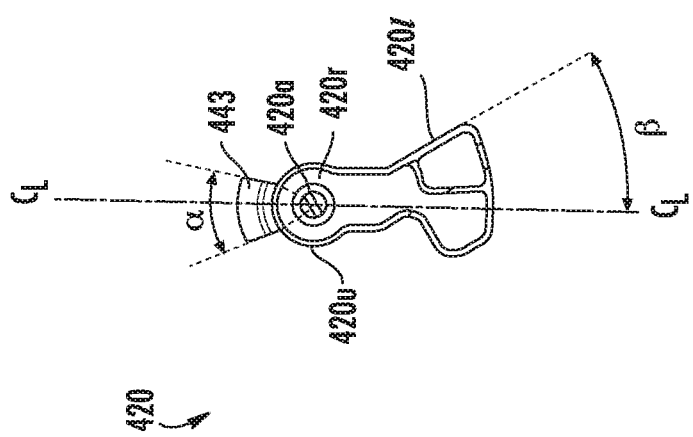
FIG. 17D is a front view of the unit latch shown in FIG. 17A.

As shown in FIGS. 17D and 17E, the lower end of the unit latch 420 can have a curved segment with a radial extent β that can be between about 30-40 degrees, such as about 32 degrees and may have a radius of curvature R of about 2.100, measured from the centerline drawn through the centerline C/L of the aperture 420a that receives the shaft 421. The flange 443 can have an angular extent "α, also measured relative to the centerline C/L, that is between about 15 degrees to about 60 degrees. The flange 443 can have a maximal height $H_2$ that is less than the maximal height $H_1$ of the unit latch 420. The flange 443 can have a height $H_2$ that is between 10-20% of the height $H_1$ of the primary body of the unit latch 420p, typically between about 0.26 inches to about 0.5 inches. The height $H_1$ of the primary body of the latch 420p can be between about 2.0-3.0 inches, such as about 2.6 inches, in some embodiments.

FIG. 17E illustrates that a respective pocket 443p can have a laterally extending maximal extent D1 that is between about 0.01 and 0.75 inches, typically about 0.0.5 inches.

FIGS. 18A and 18B illustrate an exemplary mount bracket 401 that can hold both the unit latch interlock assembly 420 and the power connection position interlock 410. As shown, the mount bracket 401 includes a primary planar wall 401w that includes a post 402, a bracket 409 for the pivot plate 412 of the interlock 410, and spaced apart unit latch shaft flanges 408. The unit latch flanges 408 include a first (front) flange $408_1$ and a second (more rearward) flange $408_2$, each cooperating to hold the shaft 421 as discussed above. The mount bracket 401 can be metal. The second flange $408_2$ can hold the detent member 444. As shown, the detent member 444 is a formed projection 444p on a wall 408w of the second flange $408_2$ that faces the first flange $408_1$. The bracket 409 can include an aperture and the wall 401w can include an aligned aperture 401a that cooperate to hold the shaft 413 of the pivot plate 412 (FIGS. 6A, 7C, for example).

Figure 19:
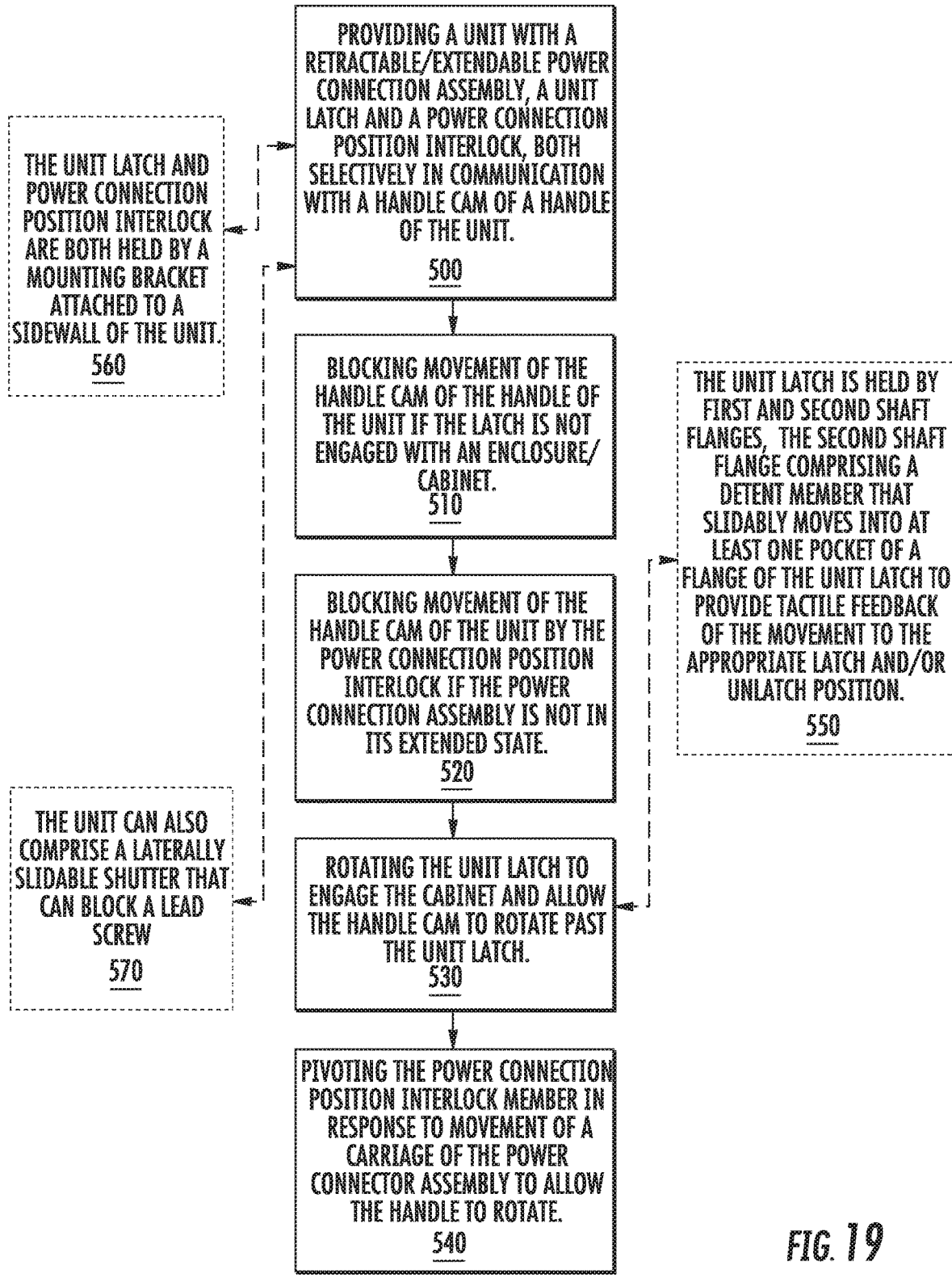
FIG. 19 is a flow chart of exemplary actions that can be used to engage and disengage interlocks of a unit according to embodiments of the present invention.

Referring to FIG. 19, actions for controlling operation of a unit are shown. A unit with a retractable/extendable power connection assembly, a unit latch and a power connection position interlock, both selectively in communication with a handle cam of a handle of the unit is provided (block 500). Movement of the handle cam of the handle of the unit is blocked by the unit latch if the latch is not engaged with an enclosure/cabinet (block 510). Movement of the handle cam of the unit by the power connection position interlock is also blocked if the power connection assembly is not in its extended state (block 520). The unit latch rotates to engage the cabinet and allow the handle cam to rotate past the unit latch (block 530). The power connection position interlock member pivots in response to movement of a carriage of the power connector assembly to allow the handle to rotate (block 540).

The unit latch can be held by first and second posts, the second post comprising a detent member that slidably moves into at least one pocket of a flange of the unit latch to provide tactile feedback of movement to the appropriate latch and/or unlatch position (block 550).

The unit latch and power connection position interlock can both be held by a mounting bracket attached to a sidewall of the unit (block 560). The unit can also comprise a laterally slidable shutter (block 570) that can block a lead screw if the breaker is On. The shutter can operate independently of the power connection assembly. If the power connection assembly is retracted (not engaged with the power bus bars) then the handle is prevented from rotating from the Off to On position by the power connection interlock 410. In this case the shutter allows access to the lead screw and the shutter cannot slide to the right to block access to the lead screw. If the power connection assembly is extended (engaged with the power bus bars) then the handle is free to rotate from the Off to On position (assuming the unit latch is also engaged and not blocking the handle cam). If the power is Off, then the shutter provides access to the lead screw. If the power is On, then the shutter slides to the right and blocks access to the lead screw.

To be clear, the terms "switch" an d "breaker" are used interchangeably herein.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A bucket assembly, comprising:
   a unit housing having a front and opposing laterally spaced apart sidewalls;
   an operator handle facing the front of the unit housing, wherein the operator handle moves vertically between ON and OFF positions;
   a laterally extending shaft attached to the operator handle and residing inside the unit housing;

a handle cam attached to the operator handle and residing inside the unit housing;

a power connection assembly held in the unit housing, the power connection assembly comprising power connectors movable between power extended and retracted positions; and a power connection position interlock in the unit housing, wherein the power connection position interlock is coupled to the power connection assembly, and wherein the power connection position interlock blocks the handle cam, which blocks the operator handle from movement toward the ON position when the power connection assembly is in the retracted position; and a coupler attached to a carriage of the power connection assembly that pivots the power connection position interlock when the power connection assembly is in the extended position to unblock the handle cam.

2. The bucket assembly of claim 1, wherein the coupler comprises a first segment extending down under the carriage a distance, wherein the first segment merges into a second segment that extends a distance forward thereof, wherein the second segment merges into a third segment that is orthogonal to the second segment, wherein the power connection position interlock comprises an upwardly extending leg that cooperates with the third segment to pivot the power connection position interlock upward when the power connection assembly is in the extended position, and wherein when the power connection assembly is in the retracted position, the third segment of the coupler resides forward of the leg which allows the upwardly extending leg to pivot down and block the handle cam from rotation toward the ON position.

3. The bucket assembly of claim 1, further comprising a mount bracket attached to one of the sidewalls of the unit housing and a biasing member, wherein the mount bracket comprises an inwardly extending first post, wherein the power connection position interlock comprises an upwardly extending leg that holds an inwardly extending second post, and wherein the biasing member is attached to the first and second posts whereby the power connection position interlock is biased to pivot down to a home position associated with the retracted position of the power connection assembly.

4. The bucket assembly of claim 1, wherein the power connection position interlock is held by a mount bracket attached to one of the sidewalls of the unit housing, wherein the mount bracket comprises a pivot plate bracket that holds a laterally extending shaft that is coupled to the power connection position interlock and allows the power connection position interlock to pivot up and down relative to the pivot plate bracket.

5. The bucket assembly of claim 4, wherein the power connection position interlock comprises a pivot plate held by the pivot plate bracket, the pivot plate comprising a front segment that extends vertically in a home position associated with the retracted position of the power connection assembly whereby the front segment of the pivot plate allows the power connection position interlock to block the handle cam from rotation toward the ON position.

6. The bucket assembly of claim 1, further comprising:
a mount bracket attached to one of the sidewalls of the unit housing;
a pivot plate bracket coupled to the mount bracket that is under a carriage of the power connection assembly and pivotably supports the power connection position interlock;
first and second spaced apart unit latch shaft support flanges that reside above the pivot plate bracket, at least one of the first and second spaced apart unit latch support flanges coupled to and/or provided by the mount bracket; and
a unit latch comprising a shaft defining a pivot axis of the unit latch that is held by the first and second spaced apart unit latch support flanges, wherein the shaft of the unit latch is orthogonal to the laterally extending shaft attached to the operator handle, wherein the unit latch pivots between latched and unlatched positions, and wherein, in the latched position, the unit latch extends out of the sidewall that is attached to the mount bracket and is configured to latch to a cabinet of a motor control center (MCC).

7. The bucket assembly of claim 6, wherein the unit latch comprises an upwardly extending flange that is above the shaft of the unit latch and that includes or is coupled to a detent member.

8. The bucket assembly of claim 7, wherein the upwardly extending flange comprises at least one pocket that slidably engages the detent member, and wherein the detent member is held by the second unit latch shaft support flange.

9. The bucket assembly of claim 8, wherein the at least one pocket is first and second spaced apart pockets having a change in depth of the upwardly extending flange relative to an adjacent wall segment thereof.

10. The bucket assembly of claim 8, wherein the detent member comprises a projection in the second flange that extends toward the front of the unit.

11. The bucket assembly of claim 8, wherein the detent member comprises a spring-loaded ball bearing held by the second flange.

12. The bucket assembly of claim 6, further comprising a spring held about the shaft of the unit latch between the first and second unit latch support flanges.

13. The bucket assembly of claim 6, wherein the handle cam comprises a plate with a curvilinear perimeter and a laterally inward extending ledge that is orthogonal to the plate, wherein the ledge contacts the unit latch when the unit latch is in the unlatched position, and wherein the ledge contacts the power connection position interlock when the power connector assembly is in the retracted position and the unit latch is in the latched position.

14. The bucket assembly of claim 1, wherein the power connection assembly further comprises an internal lead screw having a portal that is above the operator handle adjacent the front, wherein the bucket assembly further comprises a shutter that is in front of the internal lead screw, and wherein the shutter portal slides laterally to block access to the lead, screw.

15. The bucket assembly of claim 14, further comprising:
an upwardly extending shutter linkage that is attached to the laterally extending shaft of the operator handle; and
a shutter cam attached to the shutter linkage and in communication with the shutter, wherein the shutter has a shutter portal, and wherein the shutter cooperates with the shutter cam to laterally slide the shutter to a position that misaligns the shutter portal with a lead screw to block access to the lead screw when the operator handle is in a defined position.

16. A motor control center comprising the bucket assembly of claim 1.

17. A bucket assembly, comprising:
a unit housing having a front and opposing laterally spaced apart first and second sidewalls;
an operator handle facing the front of the unit housing;
a handle cam attached to the operator handle residing inside the unit housing;

a power connection assembly held in the unit housing, the power connection assembly comprising power connectors movable between power connection extended and retracted positions;

a power connection position interlock in the unit housing, wherein the power connection position interlock is coupled to the power connection assembly and is adjacent the first sidewall, and wherein the power connection position interlock blocks the handle cam, which blocks the operator handle from movement toward an ON position when the power connection assembly is in the retracted position;

at least one unit latch support flange in the unit housing, wherein the at least one unit latch support flange is coupled to the first sidewall and resides adjacent the first sidewall; and a unit latch comprising a unit latch body with upper and lower portions and an axially extending shaft that resides closer to the upper portion than the lower portion, wherein the axially extending shaft extends inwardly parallel to the first and second sidewalls of the unit housing and defines a pivot axis of the unit latch, and wherein the shaft of the unit latch is held by the at least one unit latch support flange, wherein the unit latch body pivots side-to-side between latched and unlatched positions, and wherein, in the latched position, the unit latch body extends out of the first sidewall and is configured to latch to a cabinet of a motor control center (MCC).

18. The bucket assembly of claim 17, further comprising a laterally extending shaft attached to the operator handle and residing inside the unit housing, wherein the shaft of the unit latch is orthogonal to the laterally extending shaft attached to the operator handle, wherein the laterally extending shaft attached to the operator handle extends in a lateral direction parallel to the front of the unit housing, wherein the at least one unit latch support flange comprises first and second unit latch support flanges that are spaced apart and aligned in a front-to-back direction in the unit housing, and wherein the first and second unit latch support flanges are both coupled to the first sidewall.

19. The bucket assembly of claim 17, wherein the power connection position interlock comprises a pivot plate bracket that is coupled to the first sidewall and is pivotably coupled to a pivot plate that pivots up and down, wherein the pivot plate comprises a front segment that extends vertically in a first position associated with the retracted position of the power connection assembly whereby the front segment of the pivot blocks the handle cam from rotation toward the ON position.

20. The bucket assembly of claim 19, wherein the power connection position interlock further comprises an upwardly extending leg that pivots between an angled and a vertical orientation and that resides above the pivot plate and the pivot plate bracket and under a carriage of the power connection assembly, and wherein when the power connection assembly is in the retracted position, the upwardly extending leg is in the vertical orientation and the pivot plate of the power connection position interlock blocks movement of the handle cam from rotation toward the ON position.

21. The bucket assembly of claim 17, wherein the operator handle moves vertically between ON and OFF positions, and wherein the handle cam pivots as a unit with the operator handle away from and toward the front of the unit housing about a laterally extending shaft defining a pivot axis between the ON and OFF positions.

* * * * *

UNITED STATES PATENT AND TRADEMARK OFFICE
CERTIFICATE OF CORRECTION

PATENT NO. : 10,742,004 B2  
APPLICATION NO. : 15/848103  
DATED : August 11, 2020  
INVENTOR(S) : Kroushl et al.

Page 1 of 1

It is certified that error appears in the above-identified patent and that said Letters Patent is hereby corrected as shown below:

In the Specification

Column 15, Line 8: Please correct "175*p*" to read -- 75*p* --

In the Claims

Column 20, Line 49, Claim 14: Please correct "lead, screw." to read -- lead screw. --

Signed and Sealed this  
Twenty-sixth Day of January, 2021

Drew Hirshfeld  
*Performing the Functions and Duties of the*  
*Under Secretary of Commerce for Intellectual Property and*  
*Director of the United States Patent and Trademark Office*